United States Patent
Yeh

(10) Patent No.: US 10,062,418 B2
(45) Date of Patent: Aug. 28, 2018

(54) DATA PROGRAMMING METHOD AND MEMORY STORAGE DEVICE

(71) Applicant: PHISON ELECTRONICS CORP., Miaoli (TW)

(72) Inventor: Chih-Kang Yeh, Kinmen County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 214 days.

(21) Appl. No.: 14/997,575

(22) Filed: Jan. 18, 2016

(65) Prior Publication Data

US 2017/0154656 A1 Jun. 1, 2017

(30) Foreign Application Priority Data

Nov. 27, 2015 (TW) .............. 104139609 A

(51) Int. Cl.
| | | |
|---|---|---|
| *G11C 7/00* | (2006.01) | |
| *G06F 11/10* | (2006.01) | |
| *G11C 29/52* | (2006.01) | |
| *G06F 3/06* | (2006.01) | |
| *G06F 12/02* | (2006.01) | |
| *G11C 16/34* | (2006.01) | |
| *G11C 29/42* | (2006.01) | |
| *G11C 11/56* | (2006.01) | |

(52) U.S. Cl.
CPC .............. *G11C 7/00* (2013.01); *G06F 3/0679* (2013.01); *G06F 11/1068* (2013.01); *G06F 12/0246* (2013.01); *G11C 11/5628* (2013.01); *G11C 16/345* (2013.01); *G11C 29/42* (2013.01); *G11C 29/52* (2013.01)

(58) Field of Classification Search
CPC ........... G11C 7/00; G11C 29/52; G11C 29/42; G11C 11/5628; G11C 16/345; G06F 11/1068; G06F 3/0679; G06F 12/0246
USPC ....... 714/764, 718, 763, 768, 773, 799, 805; 365/185.09, 200, 201
See application file for complete search history.

(56) References Cited

U.S. PATENT DOCUMENTS

| | | | | |
|---|---|---|---|---|
| 7,120,051 B2* | 10/2006 | Gorobets | ............ | G11C 11/5628 365/185.02 |
| 7,301,805 B2* | 11/2007 | Gorobets | ............ | G11C 11/5628 365/185.02 |
| 9,336,081 B2* | 5/2016 | Liang | .................. | G06F 11/1048 |
| 9,430,327 B2* | 8/2016 | Yeh | ........................ | G11C 29/52 |
| 9,471,421 B2* | 10/2016 | Yeh | ..................... | G06F 11/1068 |
| 9,558,847 B2* | 1/2017 | Tuers | ..................... | G11C 29/38 |
| 2006/0126390 A1* | 6/2006 | Gorobets | ............ | G11C 11/5628 365/185.22 |

(Continued)

*Primary Examiner* — John J Tabone, Jr.
(74) *Attorney, Agent, or Firm* — JCIPRNET

(57) ABSTRACT

A data programming method and a memory storage device are provided. The method includes: programming a plurality of first type physical units in a rewritable non-volatile memory module to store first data; encoding the first data to generate encoded data; receiving second data; and programming at least one of a plurality of second type physical units in the rewritable non-volatile memory module corresponding to the first type physical units to store at least a part of the second data after the first data is encoded. Therefore, the correcting ability for correcting errors in pair physical units in multi-channel programming procedure may be improved.

26 Claims, 16 Drawing Sheets

(56) References Cited

U.S. PATENT DOCUMENTS

| | | | |
|---|---|---|---|
| 2007/0014153 A1* | 1/2007 | Gorobets | G11C 11/5628 365/185.12 |
| 2008/0195900 A1* | 8/2008 | Chang | G06F 11/1068 714/718 |
| 2012/0173955 A1* | 7/2012 | Liang | G06F 11/1048 714/773 |
| 2013/0179753 A1* | 7/2013 | Flynn | G06F 12/0253 714/773 |
| 2013/0205183 A1* | 8/2013 | Fillingim | G06F 11/1044 714/773 |
| 2014/0372667 A1* | 12/2014 | Tan | G06F 12/0246 711/103 |
| 2015/0058662 A1* | 2/2015 | Yang | G06F 11/108 714/6.24 |
| 2015/0067446 A1* | 3/2015 | Yen | H03M 13/1105 714/768 |
| 2015/0293813 A1* | 10/2015 | Lin | G06F 11/1012 714/764 |
| 2016/0011785 A1* | 1/2016 | Yeh | G06F 3/0655 711/103 |
| 2016/0062828 A1* | 3/2016 | Yeh | G06F 11/1068 714/766 |
| 2016/0117244 A1* | 4/2016 | Yeh | G06F 12/0246 711/103 |
| 2016/0132387 A1* | 5/2016 | Yeh | G11C 29/52 714/766 |
| 2016/0148708 A1* | 5/2016 | Tuers | G11C 29/38 714/719 |
| 2016/0350179 A1* | 12/2016 | Lin | G11C 29/52 |
| 2017/0017570 A1* | 1/2017 | Yeh | G06F 12/0246 |
| 2017/0024153 A1* | 1/2017 | Yeh | G06F 3/0619 |

\* cited by examiner

| | | |
|---|---|---|
| 610(0) | 1 | 4 | 620(0)
| 610(1) | 2 | 5 | 620(1)
| 610(2) | 3 | 6 | 620(2)
| 610(3) | 7 | 10 | 620(3)
| 610(4) | 8 | 11 | 620(4)
| 610(5) | 9 | 12 | 620(5)
| ⋮ | ⋮ | ⋮ | ⋮
| 610(A) | Physical unit | Physical unit | 620(A)

FIG. 6B

DATA PROGRAMMING METHOD AND MEMORY STORAGE DEVICE

CROSS-REFERENCE TO RELATED APPLICATION

This application claims the priority benefit of Taiwan application serial no. 104139609, filed on Nov. 27, 2015. The entirety of the above-mentioned patent application is hereby incorporated by reference herein and made a part of this specification.

BACKGROUND

Technical Field

The disclosure relates to a memory management mechanism, and more particularly, to a data programming method and a memory storage device.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., a flash memory) ideal to be built in the portable multi-media devices as cited above.

With continuous improvements in performance of a memory chip, some memory devices can now support a multi-channel access. However, although a data accessing efficiency may be improved by increasing an amount of channels accessible in parallel, if an amount of data being written is overly large or an excessive number of the channels is used per one parallel writing, data originally stored in the memory may be influenced and the error in the influenced memory is probably cannot be completely corrected. In particular, for data belonging to a pair page in the memory, data in a lower page is most vulnerable to influences caused by programming a corresponding upper page. Conventionally, dummy data can be filled into the corresponding upper page while programming the lower page in order to protect the data in the entire pair page. Yet, this kind of mechanism will lead to a waste of storage space. Therefore, it has become an important research topic for person skilled in the art as how to maintain a correctness of the data belonging to the pair page in the memory devices supporting the multi-channel access.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

An exemplary embodiment of the disclosure provides a data programming method and a memory storage device, which are capable of maintaining a correctness of data belonging to pair physical units in a multi-channel programming procedure by using encoded data with a limited error correcting ability.

A data programming method for a rewritable non-volatile memory module is provided according to an exemplary embodiment of the disclosure. The rewritable non-volatile memory module includes a plurality of physical units. The physical units are corresponding to a plurality of channels. The physical units include a plurality of first type physical units and a plurality of second type physical units corresponding to the first type physical units. The data programming method includes: programming a plurality of physical units among the first type physical units to store first data; encoding the first data to generate encoded data; receiving second data; and programming at least one physical unit among the second type physical units to store at least a part of data of the second data after the first data is encoded.

Another exemplary embodiment of the disclosure provides a memory storage device, which includes a connection interface unit, a rewritable non-volatile memory module and a memory control circuit unit. The connection interface unit is configured to couple to a host system. The rewritable non-volatile memory module includes a plurality of physical units. The physical units are corresponding to a plurality of channels. The physical units include a plurality of first type physical units and a plurality of second type physical units corresponding to the first type physical units. The memory control circuit unit is coupled to the connection interface unit and the rewritable non-volatile memory module. The memory control circuit unit is configured to send a first write command sequence which instructs to program a plurality of physical units among the first type physical units to store first data. The memory control circuit unit is further configured to encode the first data to generate encoded data. The memory control circuit unit is further configured to receive second data. The memory control circuit unit is further configured to send a second write command sequence which instructs to program at least one physical unit among the second type physical units to store at least a part of data of the second data after the first data is encoded.

A data programming method for a rewritable non-volatile memory module is provided according to another exemplary embodiment of the disclosure. The rewritable non-volatile memory module includes a plurality of physical units. The physical units are corresponding to a plurality of channels. The physical units include a plurality of first type physical units and a plurality of second type physical units corresponding to the first type physical units. The data programming method includes: programming a plurality of physical units among the first type physical units to store first data; receiving second data; executing a first programming procedure to store a first part of the second data after the first data is stored, wherein the first programming procedure includes programming a first part of the physical units among the second type physical units through at least one first channel among the channels, wherein the first part of the physical units among the second type physical units corresponds to a first part of the physical units among the physical units for storing the first data, wherein a first amount of the first channel is less than a total number of a plurality of usable channels among the channels; and executing a second programming procedure to store a second part of the second data after the first programming procedure is executed, wherein the second programming procedure includes programming a second part of the physical units among the second type physical units through at least one second channel among the channels, wherein the second part of the physical units among the second type physical units corresponds to a second part of the physical units among the physical units for storing the first data, wherein a second amount of the second channel is less than the total number of the usable channels.

Another exemplary embodiment of the disclosure provides a memory storage device, which includes a connection interface unit, a rewritable non-volatile memory module and a memory control circuit unit. The connection interface unit is configured to couple to a host system. The rewritable non-volatile memory module includes a plurality of physical units. The physical units are corresponding to a plurality of channels. The physical units include a plurality of first type physical units and a plurality of second type physical units corresponding to the first type physical units. The memory control circuit unit is coupled to the connection interface unit and the rewritable non-volatile memory module. The memory control circuit unit is configured to send a first write command sequence which instructs to program a plurality of physical units among the first type physical units to store first data. The memory control circuit unit is further configured to receive second data. The memory control circuit unit is further configured to send a second write command sequence which instructs to execute a first programming procedure to store a first part of the second data after the first data is stored and execute a second programming procedure to store a second part of the second data after the first programming procedure is executed. The first programming procedure includes programming a first part of the physical units among the second type physical units through at least one first channel among the channels. The first part of the physical units among the second type physical units corresponds to a first part of the physical units among the physical units for storing the first data. A first amount of the first channel is less than a total number of a plurality of usable channels among the channels. The second programming procedure includes programming a second part of the physical units among the second type physical units through at least one second channel among the channels. The second part of the physical units among the second type physical units corresponds to a second part of the physical units among the physical units for storing the first data. A second amount of the second channel is less than the total number of the usable channels.

Based on the above, the first data stored in the first type physical units corresponding to multiple channels is encoded. Accordingly, when the multi-channel programming procedure is executed for the corresponding second type physical units, the correctness of the data belonging to the pair physical units may be maintained.

To make the above features and advantages of the present disclosure more comprehensible, several embodiments accompanied with drawings are described in detail as follows.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 6B is a schematic diagram illustrating usage of the physical units according to an exemplary embodiment of the disclosure.

DESCRIPTION OF THE EMBODIMENTS

Figure 1:
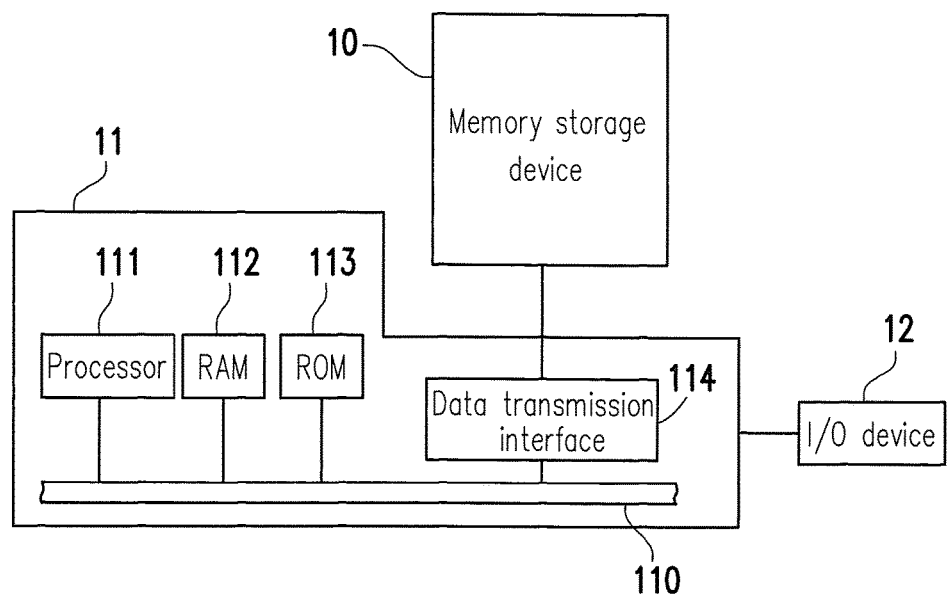
FIG. 1 is a schematic diagram illustrating a host system, a memory storage device and an I/O (input/output) device according to an exemplary embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, the memory storage device (also known as a memory storage system) includes a rewritable non-volatile memory module and a controller (also known as a control circuit). The memory storage device is usually configured together with a host system so that the host system may write data into the memory storage device or read data from the memory storage device.

Figure 2:
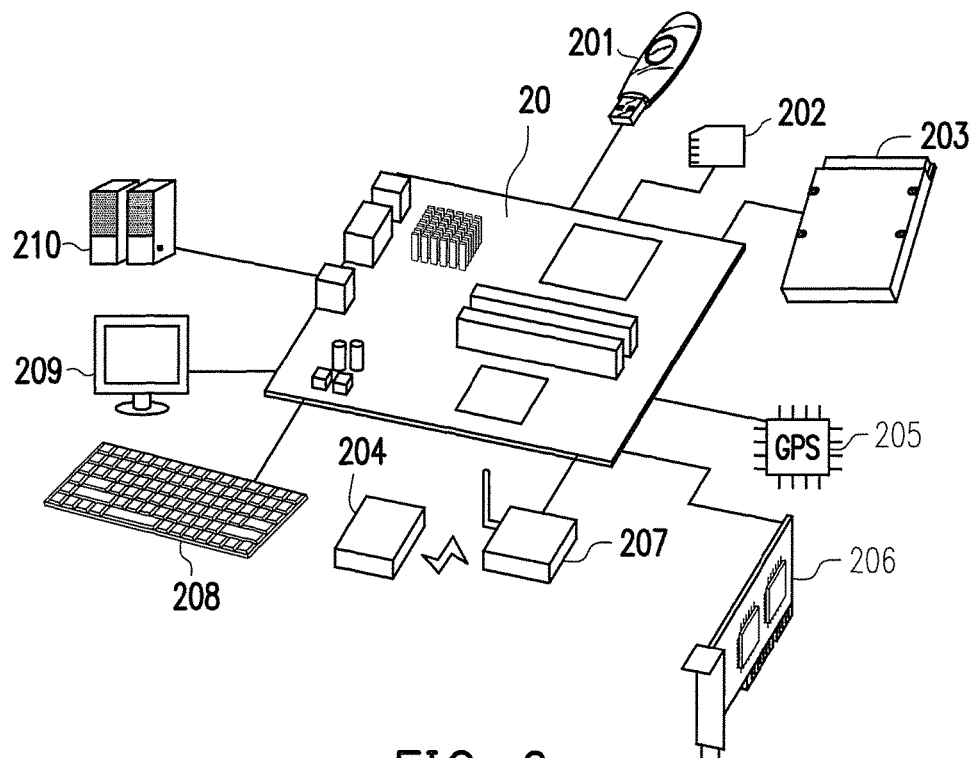
FIG. 2 is a schematic diagram illustrating a host system, a memory storage device and an I/O device according to another exemplary embodiment of the disclosure.

FIG. 1 is a schematic diagram illustrating a host system, a memory storage device and an I/O (input/output) device according to an exemplary embodiment of the disclosure. FIG. 2 is a schematic diagram illustrating a host system, a memory storage device and an I/O device according to another exemplary embodiment of the disclosure.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In this exemplary embodiment, the host system 11 is coupled to a memory storage device 10 through the data transmission interface 114. For example, the host system 11 can store data into the memory storage device 10 or read data from the memory storage device 10 through the data transmission interface 114. Further, the host system 11 is coupled to an I/O device 12 through the system bus 110. For example, the host system 11 can transmit output signals to the I/O device 12 or receive input signals from I/O device 12 through the system bus 110.

In this exemplary embodiment, the processor 111, the RAM 112, the ROM 113 and the data transmission interface 114 may be disposed on a main board 20 of the host system 11. An amount of the data transmission interface 114 may be one or more. Through the data transmission interface 114, the main board 20 may be coupled to the memory storage device 10 in a wired manner or a wireless manner. The memory storage device 10 may be, for example, a flash drive 201, a memory card 202, a SSD (Solid State Drive) 203 or a wireless memory storage device 204. The wireless memory storage device 204 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage device 204 through the wireless transmission device 207.

Figure 3:
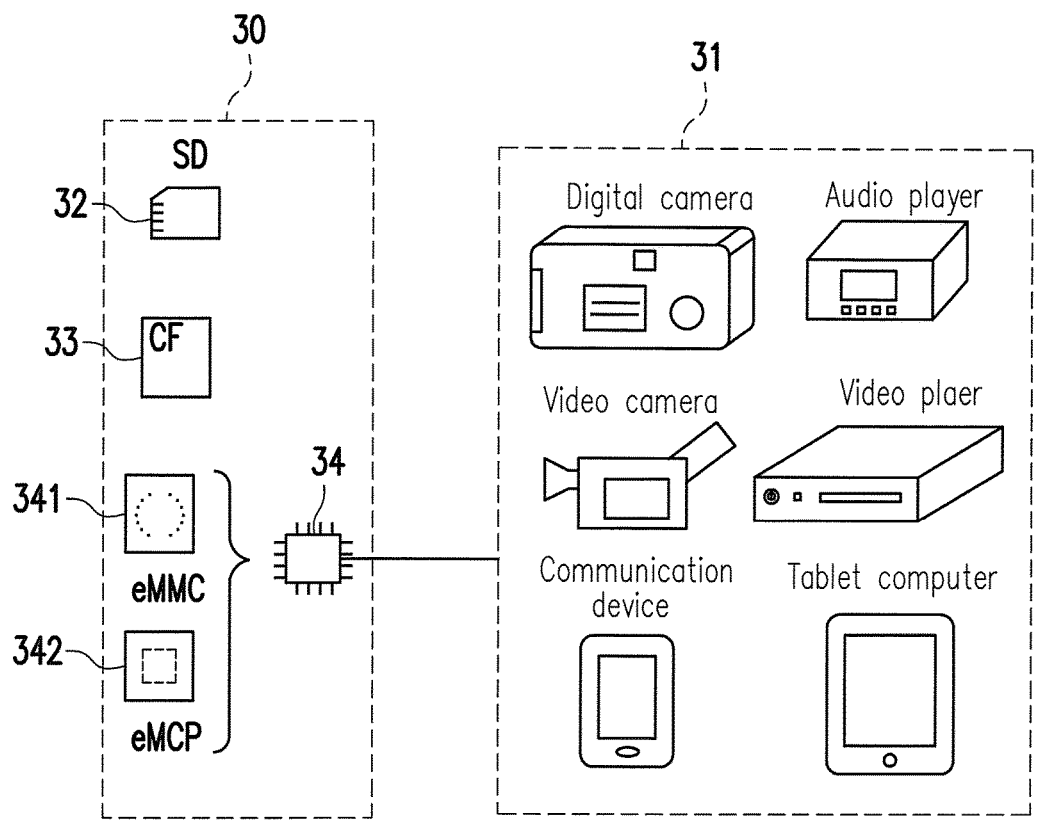
FIG. 3 is a schematic diagram illustrating a host system and a memory storage device according to another exemplary embodiment of the disclosure.

In an exemplary embodiment, aforementioned host system may be any systems capable of substantially cooperating with the memory storage device for storing data. Although the host system is illustrated as a computer system in foregoing exemplary embodiment, nonetheless, FIG. 3 is a schematic diagram illustrating a host system and a memory storage device according to another exemplary embodiment of the disclosure. Referring to FIG. 3, in another exemplary embodiment, a host system 31 may also be a system including a digital camera, a video camera, a communication device, an audio player, a video player or a tablet computer, whereas a memory storage device 30 can be various non-volatile memory devices used by the host system 31, such as a SD card 32, a CF card 33 or an embedded storage device 34. The embedded storage device 34 includes various embedded storage devices capable of directly coupling a memory module onto a substrate of the host system, such as an eMMC (embedded MMC) 341 and/or an eMCP (embedded Multi Chip Package) 342.

Figure 4:
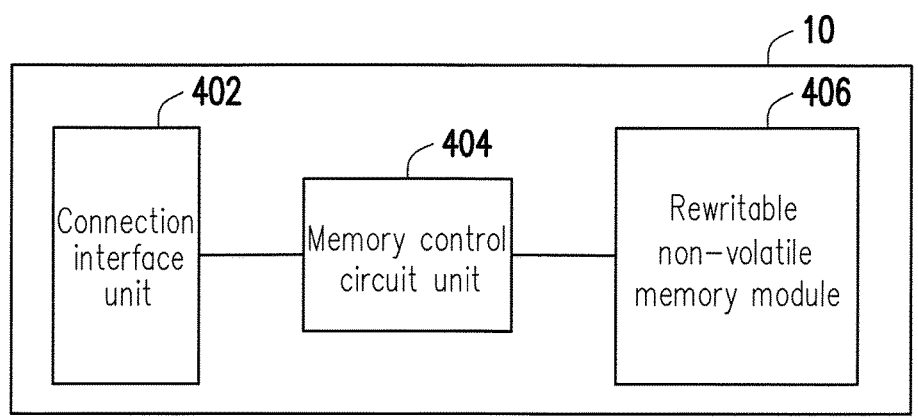
FIG. 4 is a schematic block diagram illustrating a memory storage device according to an exemplary embodiment of the disclosure.

FIG. 4 is a schematic block diagram illustrating a memory storage device according to an exemplary embodiment of the disclosure.

Referring to FIG. 4, the memory storage device 10 includes a connection interface unit 402, a memory control circuit unit 404 and a rewritable non-volatile memory module 406.

In this exemplary embodiment, the connection interface unit 402 is compatible with a SATA (Serial Advanced Technology Attachment) standard. Nevertheless, it should be understood that the disclosure is not limited thereto. The connection interface unit 402 may also be compatible to a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD (Secure Digital) interface standard, a UHS-I (Ultra High Speed-I) interface standard, a UHS-II (Ultra High Speed-II) interface standard, a MS (Memory Stick) interface standard, a Multi-Chip Package interface standard, a MMC (Multi Media Card) interface standard, an eMMC (Embedded Multimedia Card) interface standard, a UFS (Universal Flash Storage) interface standard, an eMCP (embedded Multi Chip Package) interface standard, a CF (Compact Flash) interface standard, an IDE (Integrated Device Electronics) interface standard or other suitable standards. The connection interface unit 402 and the memory control circuit unit 404 may be packaged into one chip, or the connection interface unit 402 is distributed outside of a chip containing the memory control circuit unit 404.

The memory control circuit unit 404 is configured to execute a plurality of logic gates or control commands which are implemented in a hardware form or in a firmware form and execute operations of writing, reading or erasing data in the rewritable non-volatile memory storage module 406 according to the commands of the host system 11.

The rewritable non-volatile memory module 406 is coupled to the memory control circuit unit 404 and configured to store data written from the host system 11. The rewritable non-volatile memory module 406 may be a SLC (Single Level Cell) NAND flash memory module (i.e., a flash memory module capable of storing one bit in one memory cell), a MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), other flash memory modules or any memory module having the same features.

The memory cells in the rewritable non-volatile memory module 406 are disposed in an array. Hereinafter, a two-dimensional array and a three-dimensional array are used to describe the memory cell arrays in different exemplary embodiments, respectively. However, it should be noted that, the following exemplary embodiments are simply several examples of the memory cell array. In other exemplary embodiments, a disposition method of the memory cell array may be adjusted to satisfy actual requirements.

Figure 5A:
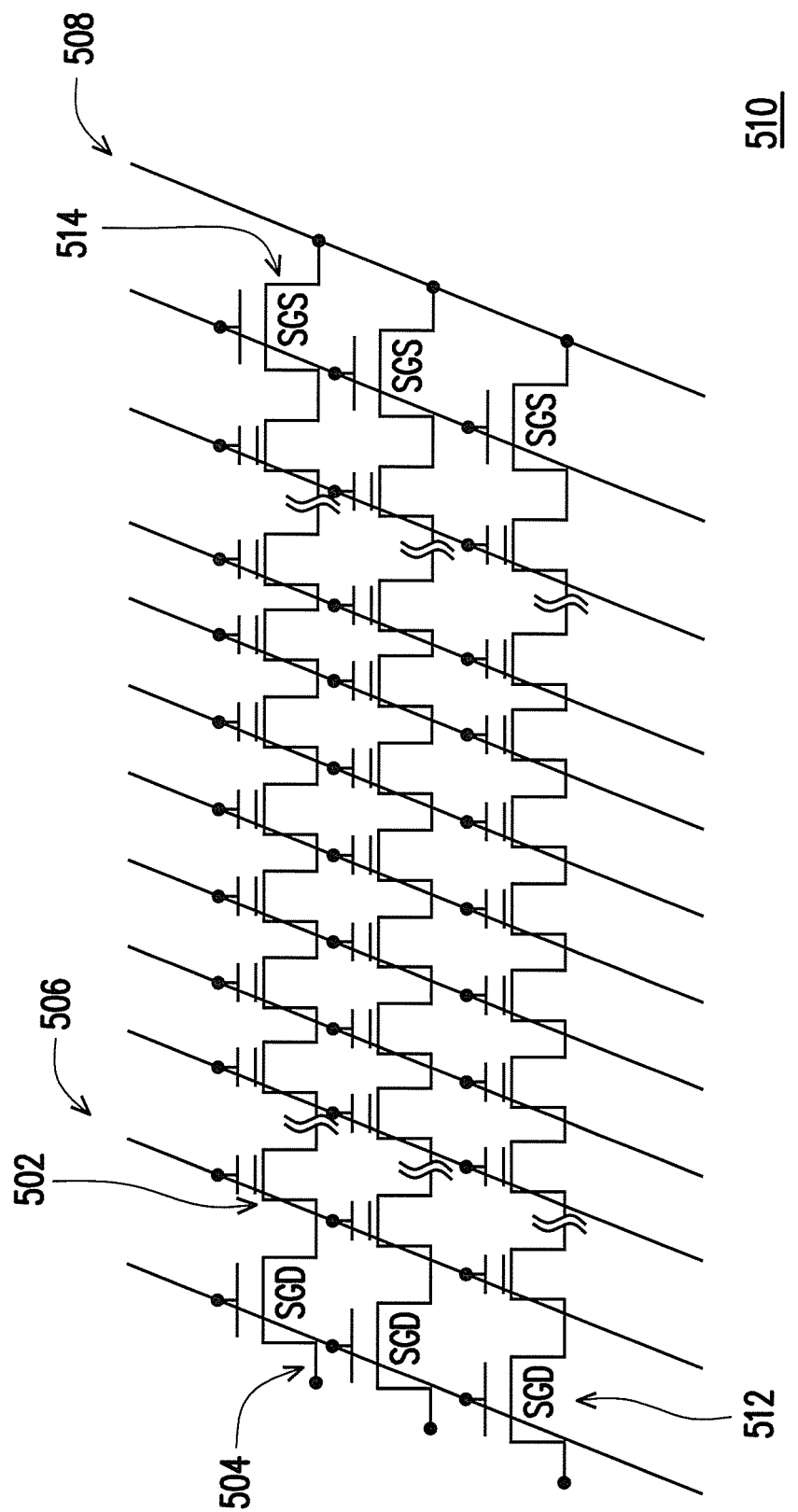
FIG. 5A is a schematic diagram illustrating a memory cell array according to an exemplary embodiment of the disclosure.

FIG. 5A is a schematic diagram illustrating a memory cell array according to an exemplary embodiment of the disclosure.

Referring to FIG. 5A, a memory cell array 510 includes a plurality of memory cells 502 used to store data, a plurality of SGD (select gate drain) transistors 512, a plurality of SGS (select gate source) transistors 514, as well as a plurality of bit lines 504, a plurality of word lines 506, a common source line 508 connected to the memory cells. The memory cells 502 are disposed in an array at intersections of the bit lines 504 and the word lines 506.

Figure 5B:
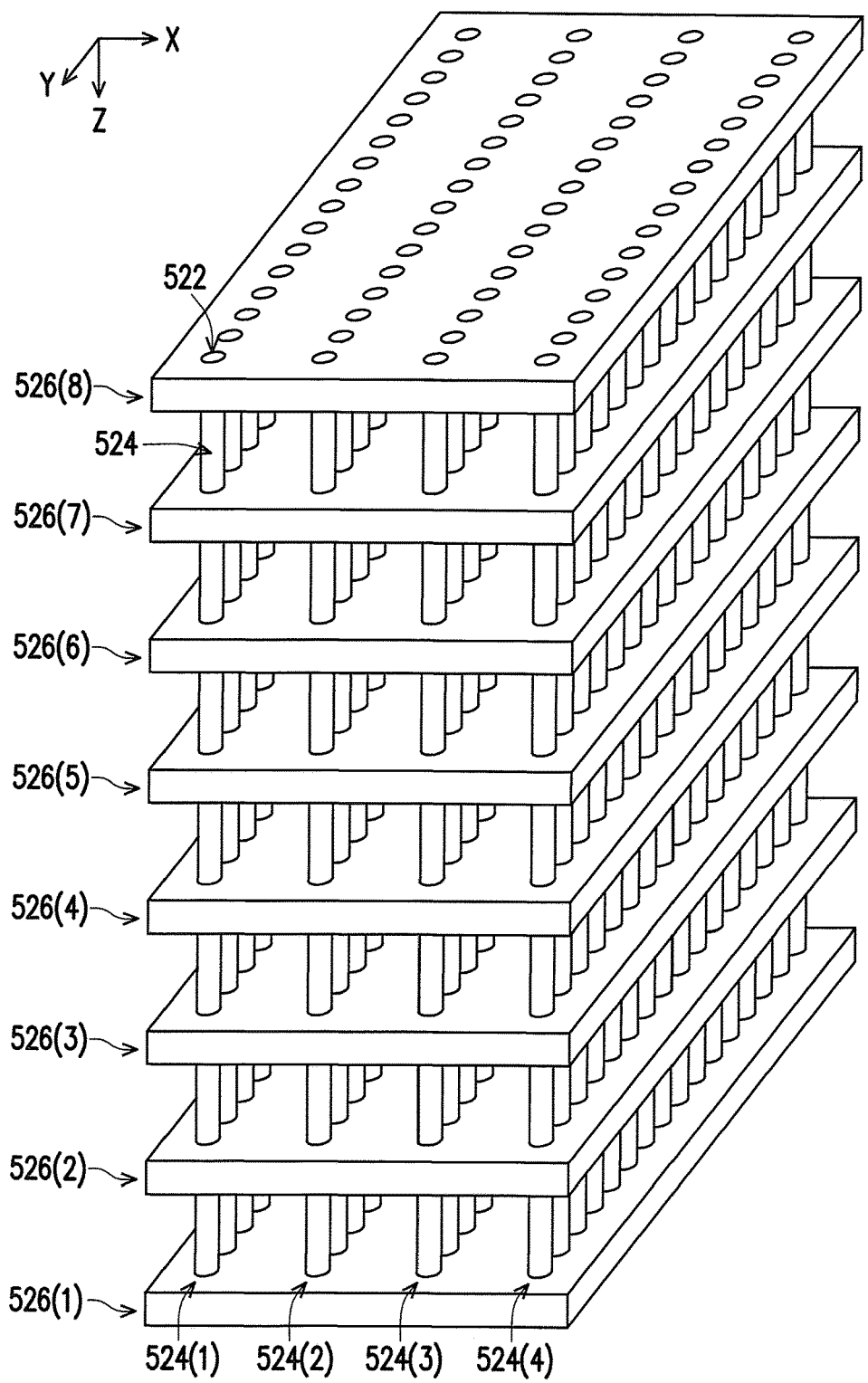
FIG. 5B is a schematic diagram illustrating a memory cell array according to another exemplary embodiment of the disclosure.

FIG. 5B is a schematic diagram illustrating a memory cell array according to another exemplary embodiment of the disclosure.

Referring to FIG. 5B, in this exemplary embodiment, the memory cell array includes a plurality of memory cells 522 configured to store data, a plurality of bit line sets 524(1) to 524(4) and a plurality of word line layers 526(1) to 526(8). The bit line sets 524(1) to 524(4) are independent (e.g., separated) from one another and arranged along a first direction (e.g., X-axis). Each of the bit line sets 524(1) to 524(4) includes a plurality of bit lines 524 independent from one another (e.g., separated from one another). The bit lines 524 included in the bit line sets 524(1) to 524(4) are arranged along a third direction (e.g., Y-axis) and extended towards a second direction (e.g., Z-axis). The word line layers 526(1) to 526(8) are independent from one another (e.g., separated from one another) and stacked along the second direction. In this exemplary embodiment, each of the word line layers 526(1) to 526(8) may be regarded as one word line plane. The memory cell 522 is disposed at each intersection of each of the bit lines 524 in the bit line sets 524(1) to 524(4) and the word line layers 526(1) to 526(8). However, in another exemplary embodiment, one bit line set may include more or less bit lines, and one word line layer may also allow more or less bit lines to pass through.

In the rewritable non-volatile memory module 406, one or more bits are stored based on changes on a voltage (hereinafter, also known as a threshold voltage) of each of the memory cells. When a write command sequence or a read command sequence is received from the memory control circuit unit 404, a control circuit (not illustrated) in the rewritable non-volatile memory module 406 controls a voltage applied to one specific word line (or word line layer) or one specific bit line (or bit line set) in order to change the threshold voltage of at least one memory cell or detect a storage state of the memory cell. For example, a charge trapping layer is provided between a control gate and a channel in each of the memory cells. Amount of electrons in the charge trapping layer may be changed by applying a write voltage (or a program voltage) to the control gate thereby changing the threshold voltage of the memory cell. This process of changing the threshold voltage is also known as "writing data into the memory cell" or "programming the memory cell". With changes in the threshold voltage, each of the memory cells in the rewritable non-volatile memory module 406 can have a plurality of storage statuses. Which of the storage statuses the memory cell belongs to may be determined by applying a read voltage, so as to obtain the one or more bits stored in the memory cell.

The memory cells of the rewritable non-volatile memory module 406 constitute a plurality of physical programming units, and the physical programming units constitute a plurality of physical erasing units. Specifically, the memory cells on the same word line or the same word line layer constitute one or more of the physical programming units. For example, if the rewritable non-volatile memory module 406 is the MLC NAND flash memory module, the memory cells on intersections of the same word line (or word line layer) and the bit lines constitute 2 physical programming units. Alternatively, if the rewritable non-volatile memory module 406 is the TLC NAND flash memory module, the memory cells on the intersections of the same word line (or word line layer) and the bit lines constitute 3 physical programming units.

In this exemplary embodiment, the physical programming unit is a minimum unit for programming. That is, the programming unit is the minimum unit for writing data. For example, the physical programming unit is a physical page or a physical sector. When the physical programming units are the physical page, these physical programming units usually include a data bit area and a redundancy bit area. The data bit area includes multiple physical sectors configured to store user data, and the redundant bit area is configured to store system data (e.g., an error correcting code). In this exemplary embodiment, the data bit area contains 32 physical sectors, and a size of each physical sector is 512 bytes (B). However, in other exemplary embodiments, the data bit area may also include 8, 16 physical sectors or different number (more or less) of the physical sectors, and the size of each physical sector may also be greater or smaller. On the other hand, the physical erasing unit is the minimal unit for erasing. Namely, each physical erasing unit contains the least number of memory cells to be erased together. For instance, the physical erasing unit is a physical block.

In an exemplary embodiment where one memory cell is capable of storing multiple bits (e.g., the MLC or TLC flash memory module), the physical programming units belonging to the same word line (or the same word line layer) may at least be classified into a first type physical programming unit and a second type physical programming unit. For example, in the MLC NAND flash memory module, a LSB (Least Significant Bit) of one memory cell belongs to the first type physical programming unit, and a MSB (Most Significant Bit) of one memory cell belongs to the second type physical programming unit. Generally, a writing speed of the first type physical programming unit is greater than a writing speed of the second type physical programming unit. Moreover, a reliability of the first type physical programming unit is normally higher than a reliability of the second type physical programming unit. In an exemplary embodiment, the first type physical programming unit is also known as a fast page or a lower physical programming unit, and the second type physical programming unit is also known as a slow page or an upper physical programming unit.

In this exemplary embodiment, the rewritable non-volatile memory module 406 has a plurality of memory planes. The memory planes belong to one or more memory dies. In this exemplary embodiment, one memory plane is laid out as one device. Nonetheless, in another exemplary embodiment, a plurality of the memory planes may also be laid out as one device. Each memory plane may include one or more memory cell arrays. For example, each memory plane may be the memory cell array 510 of FIG. 5A, the memory cell array of FIG. 5B or memory cell array of other types.

Figure 6A:
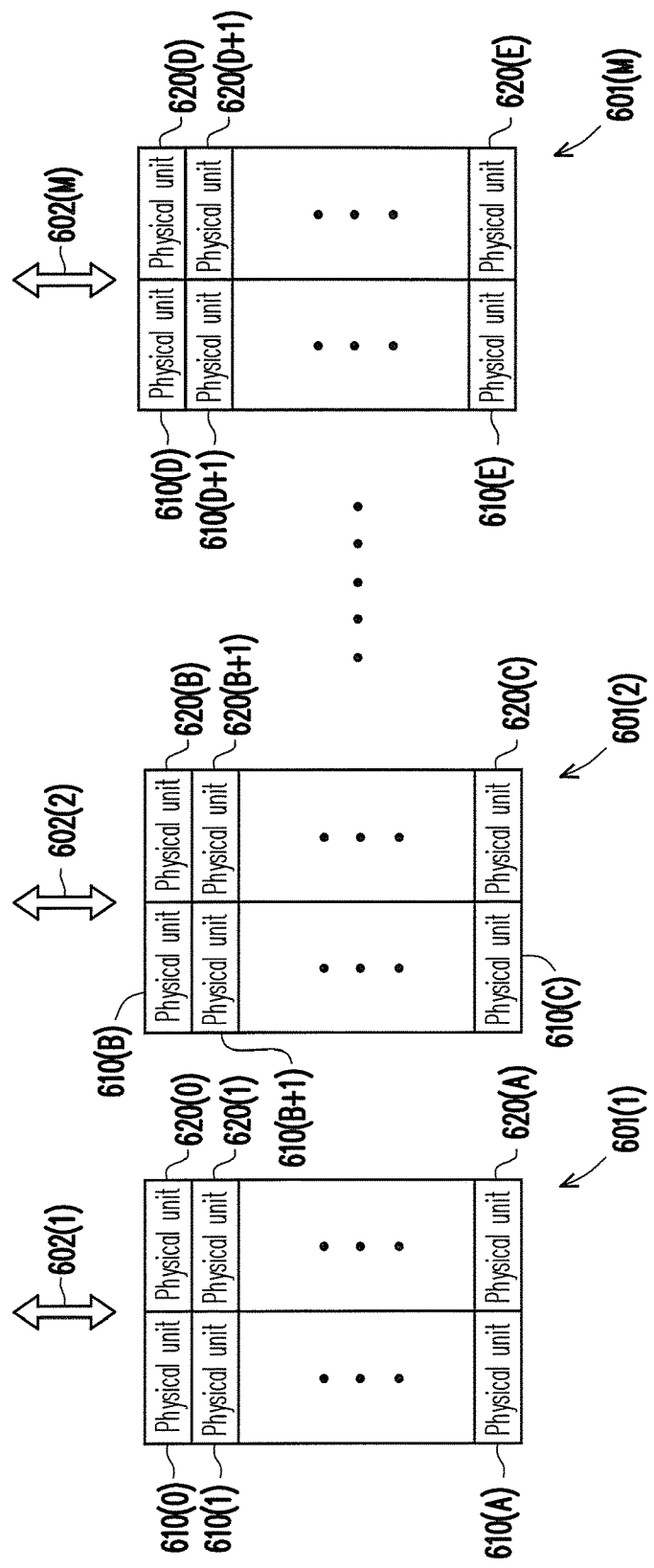
FIG. 6A is a schematic diagram illustrating a rewritable non-volatile memory module according to an exemplary embodiment of the disclosure.

FIG. 6A is a schematic diagram illustrating a rewritable non-volatile memory module according to an exemplary embodiment of the disclosure. It is worth mentioning that, this exemplary embodiment takes the MLC NAND flash memory as an example, but the related operations are also applicable to flash memory of other types (e.g., the TLC NAND flash memory).

Referring to FIG. 6A, the rewritable non-volatile memory module 406 includes a M number of memory planes 601(1) to 601(M). Each of the memory planes 601(1) to 601(M) includes a plurality of memory cells. In the memory planes 601(1) to 601(M), the memory cells belonging to the same memory plane may be laid out as a plurality of physical units. For example, the physical units belonging to the same memory plane includes a plurality of first type physical units and a plurality of second type physical units corresponding to the first type physical units. For example, the memory plane 601(1) includes the first type physical units 610(0) to 610(A) and the second type physical units 620(0) to 620(A), the memory plane 601(2) includes the first type physical units 610(B) to 610(C) and the second type physical units 620(B) to 620(C); and by analogy, the memory plane 601(M) includes the first type physical units 610(D) to 610(E) and the second type physical units 620(D) to 620(E). Among which, the first type physical unit 610(0) is corresponding to the second type physical unit 620(0), the first type physical unit 610(1) is corresponding to the second type physical unit 620(1); and by analogy, the first type physical unit 610(E) is corresponding to the second type physical unit 620(E).

In this exemplary embodiment, the physical unit refers to the physical programming unit. Accordingly, the first type physical unit refers to aforesaid first type physical programming unit, and the second type physical unit refers to aforesaid second type physical programming unit. In addition, one first type physical unit and one second type physical unit corresponding to each other refer to the physical units belonging to the same word line (or the same word line layer). For example, the first type physical unit 610(0) and the second type physical unit 620(0) belong to the same word line (or the same word line layer), the first type physical unit 610(1) and the second type physical unit 620(1) belong to the same word line (or the same word line layer); and by analogy, the first type physical unit 610(E) and the second type physical unit 620(E) also belong to the same word line (or the same word line layer). However, in another exemplary embodiment, one physical unit may also be constituted by any amount of the memory cells on the same bit line (or the bit line set).

In this exemplary embodiment, in one group of the physical units corresponding to each other, the first type physical unit is the first to be used (e.g., programmed); and after that, the second type physical unit is then used (e.g., programmed).

FIG. 6B is a schematic diagram illustrating usage of the physical units according to an exemplary embodiment of the disclosure.

Referring to FIG. 6B, the memory plane 601(1) in FIG. 6A is taken as an example, in which numbers 1 to 12 represent a use sequence (or a programming sequence) of the physical units for storing data. During process of programming the physical units for storing data, the first type physical units 610(0) to 610(2) marked as 1 to 3 are sequentially programmed; after the first type physical unit 610(2) is programmed, the second type physical units 620(0) to 620(2) marked as 4 to 6 are sequentially programmed; after the second type physical unit 620(2) is programmed, the first type physical units 610(3) to 610(5) marked as 7 to 9 are sequentially programmed; and after the first type physical unit 610(5) is programmed, the second type physical units 620(3) to 620(5) marked as 10 to 12 are sequentially programmed.

It is worth mentioning that, the numbers 1 to 12 in the exemplary embodiment of FIG. 6B are merely an example. In another exemplary embodiment, the use sequence of the physical units in each of the memory planes may also be adjusted depending on actual requirements. For example, in another exemplary embodiment of FIG. 6B, the use sequence of the physical units may also be sequentially programming the first type physical unit 610(0), the second type physical unit 620(0), the first type physical unit 610(1), the second type physical unit 620(1), the first type physical unit 610(2), the second type physical unit 620(2), the first type physical unit 610(3), the second type physical unit 620(3), the first type physical unit 610(4), the second type physical unit 620(4), the first type physical unit 610(5) and the second type physical unit 620(5), depending on actual requirements. Further, the exemplary embodiment of FIG. 6B, takes the example in which the data is consecutively stored into the physical units belonging to the same memory plane (i.e., the memory plane 601(1)). However, in another exemplary embodiment, the data may also be stored into the physical units in multiple memory planes in staggered or parallel manner as long as the use sequence of the physical units in each of the memory planes satisfies a predetermined rule.

In an exemplary embodiment, in a programming operation where the physical units in the multiple memory planes are programmed in parallel, the physical units programmed in parallel in each of the memory planes are all (or can only be) either the first type physical units or second type physical units. Taking FIG. 6A for example, it is assumed that all of the physical units are usable, a part of the first type physical units in each of the memory planes is first programmed in parallel in one programming procedure; and then, a part of the second type physical units in each of the memory planes is programmed in parallel in the next programming procedure. However, in another exemplary embodiment, the physical units in the multiple memory planes being programmed in parallel may include both the first type physical units and the second type physical units at the same time.

In this exemplary embodiment, the memory control circuit unit 404 (or a control circuit (not illustrated) in the rewritable non-volatile memory module 406) accesses the physical units (or the memory cells) in the memory planes 601(1) to 601(M) through channels 602(1) to 602(M). For example, the channel 602(1) is used to access the physical units in the memory plane 601(1), the channel 602(2) is used to access the physical units in the memory plane 601(2); and by analogy, the channel 602(M) is used to access the physical units in the memory plane 601(M).

In an exemplary embodiment, the physical units (e.g., the first type physical units 610(0) to 610(A) and the second type physical units 620(0) to 620(A)) belonging to the memory plane 601(1) may also be regarded as the physical units corresponding to the channel 602(1), the physical units (e.g., the first type physical units 610(B) to 610(C) and the second type physical units 620(B) to 620(C)) belonging to the memory plane 601(2) may also be regarded as the physical units corresponding to the channel 602(2); and by analogy, the physical units (e.g., the first type physical units 610(D) to 610(E) and the second type physical units 620(D) to 620(E)) belonging to the memory plane 601(M) may also be regarded as the physical units corresponding to the channel 602(M).

In this exemplary embodiment, at least two of the channels 602(1) to 602(M) support data reading or writing in parallel. For example, when one specific data is to be stored, the specific data may be programmed into the physical units belonging to multiple memory planes in parallel. For example, the first type physical units 610(0) and 610(B) may be programmed in parallel to store the specific data. Alternatively, the second type physical units 620(0), 620(B) and 620(D) may be programmed in parallel to store one specific data. Further, when one specific read command is received from the host system 11, the data may also be read from the physical units belonging to multiple memory planes in parallel. For example, the data may also be read from the first type physical units 610(0), 610(B) and 610(D) in parallel. Accordingly, an accessing efficiency or an accessing speed of the data may be improved.

Figure 7:
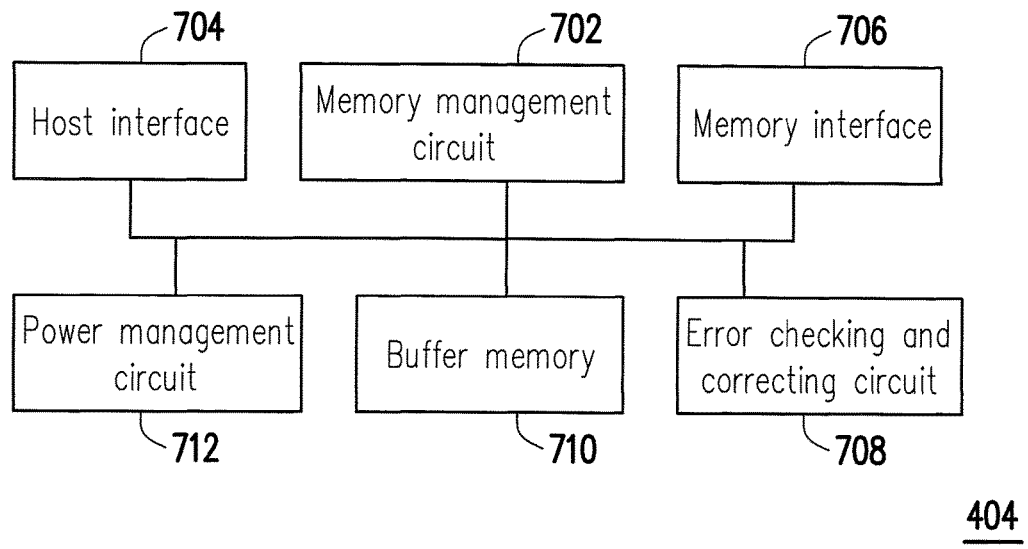
FIG. 7 is a schematic block diagram illustrating a memory control circuit unit according to an exemplary embodiment of the disclosure.

FIG. 7 is a schematic block diagram illustrating a memory control circuit unit according to an exemplary embodiment of the disclosure.

Referring to FIG. 7, the memory control circuit unit 404 includes a memory management circuit 702, a host interface 704, a memory interface 706 and an error checking and correcting circuit 708.

The memory management circuit 702 is configured to control overall operations of the memory control circuit unit 404. Specifically, the memory management circuit 702 has a plurality of control commands. During operations of the memory storage device 10, the control commands are executed to execute various operations such as writing, reading and erasing data. Hereinafter, description regarding operations of the memory management circuit 702 or any circuit element in the memory control circuit unit 404 is equivalent to description regarding operations of the memory control circuit unit 404.

In this exemplary embodiment, the control commands of the memory management circuit 702 are implemented in form of firmware. For instance, the memory management circuit 702 has a microprocessor unit (not illustrated) and a ROM (not illustrated), and the control commands are burned into the ROM. During the operations of the memory storage device 10, the control commands are executed by the microprocessor to perform operations of writing, reading or erasing data.

In another exemplary embodiment, the control commands of the memory management circuit 702 may also be stored as program codes in a specific area (for example, the system area in a memory dedicated for storing the system data) of the rewritable non-volatile memory module 406. In addition, the memory management circuit 702 has a microprocessor unit (not illustrated), the read only memory (not illustrated) and a random access memory (not illustrated). More particularly, the ROM has a boot code, which is executed by the microprocessor unit to load the control commands stored in the rewritable non-volatile memory module 406 to the RAM of the memory management circuit 702 when the memory control circuit unit 404 is enabled. Thereafter, the control commands are executed by the microprocessor unit to execute operations of writing, reading or erasing data.

Further, in another exemplary embodiment, the control commands of the memory management circuit 702 may also be implemented in form of hardware. For example, the memory management circuit 702 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured to manage the physical units of the rewritable non-volatile memory module 406 or a group thereof. The memory writing circuit is configured to issue a write command sequence for the rewritable non-volatile memory module 406 in order to write data into the rewritable non-volatile memory module 406. The memory reading circuit is configured to issue a read command sequence for the rewritable non-volatile memory module 406 in order to read data from the rewritable non-volatile memory module 406. The memory erasing circuit is configured to issue an erase command sequence for the rewritable non-volatile memory module 406 in order to erase data from the rewritable non-volatile memory module 406. The data processing circuit is configured to process both the data to be written into the rewritable non-volatile memory module 406 and the data to be read from the rewritable non-volatile memory module 406. Each of the write command sequence, the read command sequence and the erase command sequence may include one or more program codes or command codes, respectively, and instruct the rewritable non-volatile memory module 406 to perform the corresponding operations, such as writing, reading and erasing. In an exemplary embodiment, the memory management circuit 702 may further issue command sequence of other types to the rewritable non-volatile memory module 406 for instructing to execute the corresponding operations.

The host interface 704 is coupled to the memory management circuit 702 and configured to receive and identify commands and data sent from the host system 11. In other words, the commands and data sent from the host system 11 are passed to the memory management circuit 702 through the host interface 704. In this exemplary embodiment, the host interface 704 is compatible with the SATA standard. However, it should be understood that the present disclosure is not limited thereto, and the host interface 704 may also be compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 706 is coupled to the memory management circuit 702 and configured to access the rewritable non-volatile memory module 406. That is, data to be written into the rewritable non-volatile memory module 406 is converted into a format acceptable by the rewritable non-volatile memory module 406 through the memory interface 706. Specifically, if the memory management circuit 702 intends to access the rewritable non-volatile memory module 406, the memory interface 706 can send the corresponding command sequences. For example, the command sequences may include the write command sequence which instructs to write data, the read command sequence which instructs to read data, the erase command sequence which instructs to erase data, and other corresponding command sequences for instructing to perform various memory operations (e.g., changing read voltage levels or performing a garbage collection procedure). These command sequences are generated by the memory management circuit 702 and transmitted to the rewritable non-volatile memory module 406 through the memory interface 706, for example. The command sequences may include one or more signals, or data stored in the bus. The signals or the data may include command codes and programming codes. For example, in a read command sequence, information such as identification codes and memory addresses are included.

The error checking and correcting circuit 708 is coupled to the memory management circuit 702 and configured to execute an error checking and correcting process to ensure a correctness of data. Specifically, when the memory management circuit 702 receives the write command from the host system 11, the error checking and correcting circuit 708 generates an ECC (error correcting code) and/or an EDC (error detecting code) for data corresponding to the write command, and the memory management circuit 702 writes data corresponding to the write command and the corresponding ECC and/or the EDC into the rewritable non-volatile memory module 406. Later, when the memory management circuit 702 reads the data from the rewritable non-volatile memory module 406, the corresponding ECC and/or the EDC are also read, and the error checking and correcting circuit 708 executes the error checking and correcting procedure on the read data based on the ECC and/or the EDC.

In an exemplary embodiment, the memory control circuit unit 404 further includes a buffer memory 710 and a power management circuit 712.

The buffer memory 710 is coupled to the memory management circuit 702 and configured to temporarily store data and commands from the host system 11 or data from the rewritable non-volatile memory module 406. The power management unit 712 is coupled to the memory management circuit 702 and configured to control a power of the memory storage device 10.

In this exemplary embodiment, a basic unit of an encoding procedure performed by the error checking and correcting circuit 708 is one frame. One frame includes a plurality of data bits. In this exemplary embodiment, one frame includes 256 bits. However, in another exemplary embodiment, one frame may also includes more or less bits.

In this exemplary embodiment, the error checking and correcting circuit 708 can perform a single-frame encoding for the data stored in the same physical unit and can also perform a multi-frame encoding for data stored in multiple physical units. Each of the single-frame encoding and the multi-frame encoding may adopt encoding algorithms including at least one of a LDPC (low density parity code), a BCH code, a convolutional code or a turbo code. Alternatively, in another exemplary embodiment, the multi-frame encoding may also include a RS codes (Reed-solomon codes) algorithm. Further, in another exemplary embodiment, other encoding algorithms not mentioned above may also be adopted, which are omitted herein. According to the adopted encoding algorithm, the error checking and correcting circuit 708 can encode the data to be protected, so as to generate the corresponding ECC and/or the EDC. For clear description, the ECC and/or the EDC generated by encoding are collectively known as encoded data.

Figure 8:
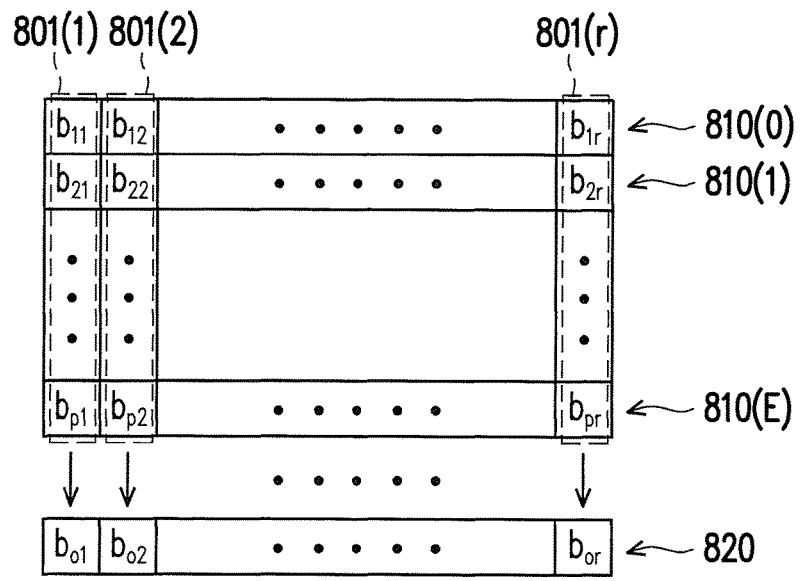
FIG. 8 is a schematic diagram illustrating a multi-frame encoding according to an exemplary embodiment of the disclosure.

FIG. 8 is a schematic diagram illustrating a multi-frame encoding according to an exemplary embodiment of the disclosure.

Referring to FIG. 8, encoded data 820 correspondingly generated by encoding the data stored in physical units 810(0) to 810(E) is taken as an example, in which at least a part of data stored by each of the physical units 810(0) to 810(E) may be regarded as one frame. In the multi-frame encoding, the data in the physical units 810(0) to 810(E) are encoded on basis of a position of each bit (or byte). For example, bits $b_{11}, b_{21}, \ldots, b_{p1}$ at a position 801(1) are encoded as a bit $b_{o1}$ in the encoded data 820, bits $b_{12}, b_{22}, \ldots, b_{p2}$ at a position 801(2) are encoded as a bit $b_{o2}$ in the encoded data 820; and by analogy, bits $b_{1r}, b_{2r}, \ldots, b_{pr}$ at a position 801(r) are encoded as a bit $b_{or}$ in the encoded data 820. Thereafter, the data read from the physical units 810(0) to 810(E) may be decoded according to the encoded data 820, so as to attempt correcting possible errors in the read data.

Herein, in another exemplary embodiment of FIG. 8, the data used for generating the encoded data 820 may also include redundancy bits corresponding to the data bits in the data stored in the physical units 810(0) to 810(E). Taking the data stored in the physical unit 810(0) for example, the redundancy bits are, for example, generated by performing the single-frame encoding for the data bits stored in the physical unit 810(0).

In this exemplary embodiment, the memory management circuit 702 instructs to program a plurality of first type physical units belonging to one or more memory planes to store one specific data (hereinafter, also known as first data). The error checking and correcting circuit 708 encodes the first data to generate encoded data and the memory management circuit 702 receives second data. After the first data is encoded, the memory management circuit 702 instructs to program at least one of a plurality of second type physical units corresponding to the first type physical units to store at least a part of data of the second data. By doing so, even if the data in the first type physical units is influenced by emergencies (e.g., power loss) during process of programming the second type physical units corresponding to the first type physical units which is already stored with the data, errors in the first type physical units being influenced may simply be corrected according to the encoded data generated in advance.

Figure 9:
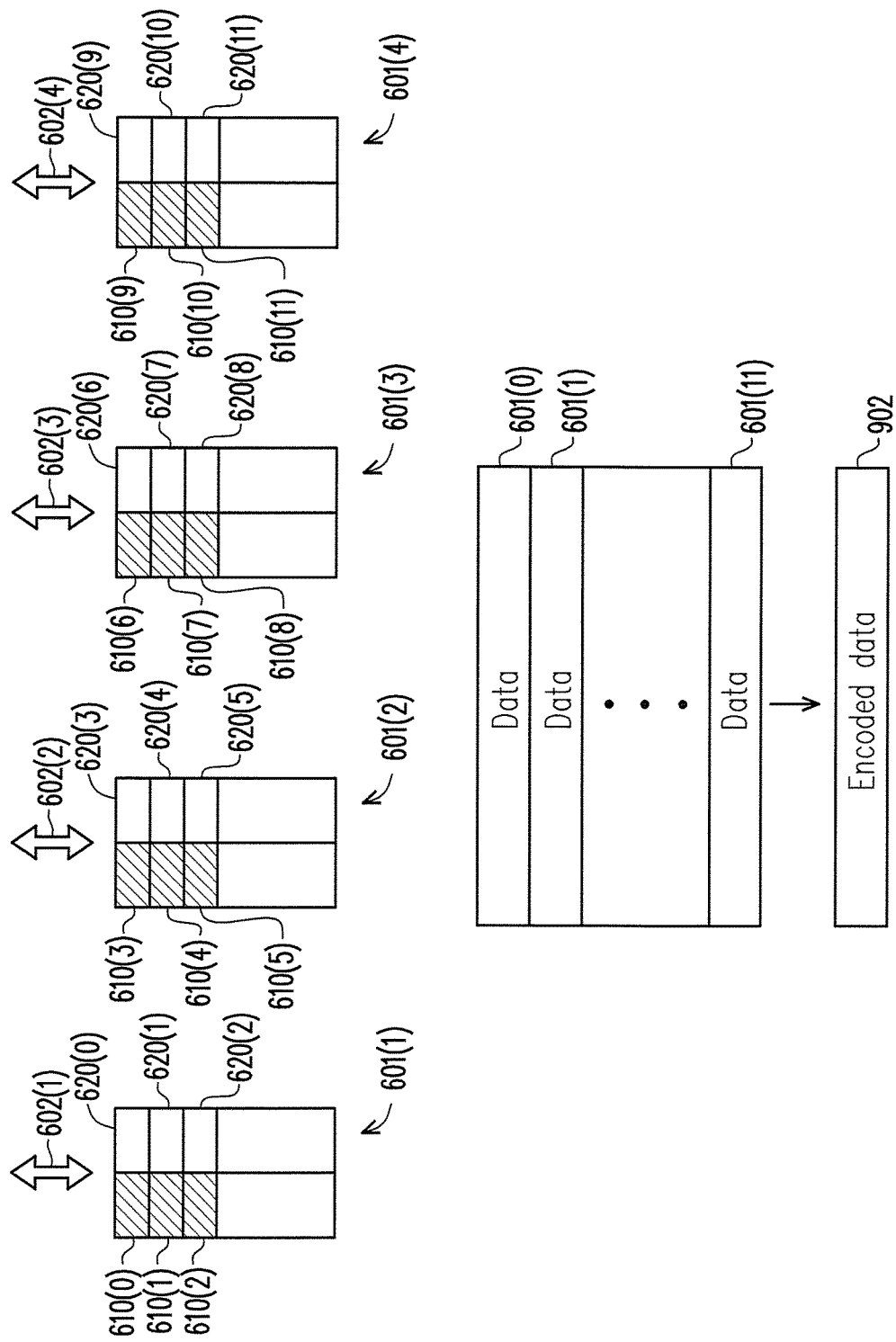
FIG. 9 illustrates a schematic diagram for programming the first type physical units and encoding the first data according to an exemplary embodiment of the disclosure.

FIG. 9 illustrates a schematic diagram for programming the first type physical units and encoding the first data according to an exemplary embodiment of the disclosure.

Referring to FIG. 9, it is assumed that the rewritable non-volatile memory module 406 has four memory planes 601(1) to 601(4) and physical units in the memory planes 601(1) to 601(4) may be accessed through channels 602(1) to 602(4), respectively. However, in another exemplary embodiment, the rewritable non-volatile memory module 406 may also include more or less memory planes and the memory planes may also be accessed through more or less channels.

In this exemplary embodiment, the memory management circuit 702 programs the first type physical units 610(0) to 610(11) to store first data, and the error checking and correcting circuit 708 executes the multi-frame encoding to encode the first data in order to generate encoded data 902. The related encoding operation has been introduced in details above, which is not repeated hereinafter. The encoded data 902 is then stored in the rewritable non-volatile memory module 406. Thereafter, if the data stored in the first type physical units 610(0) to 610(11) is influenced during process of programming any one of the second type physical units 620(0) to 620(11) corresponding to the first type physical units 610(0) to 610(11), the error checking and correcting circuit 708 can attempt correcting errors in the data stored in the first type physical units 610(0) to 610(11) by using the encoded data 902.

It is worth mentioning that, in another exemplary embodiment of FIG. 9, an amount of the first type physical units used to generate encoded data 902 may also be more or less, and the first type physical units used for generating the encoded data 902 may also be distributed in more or less memory planes. For example, in an exemplary embodiment, it is also possible that the first type physical units used for generating the encoded data 902 are located within only one memory plane.

In an exemplary embodiment, the operation of encoding the first data may also be executed at any time point to protect the data stored in the first type physical units. In another exemplary embodiment, the memory management circuit 702 determines whether a predefined operating command (hereinafter, also known as a specific operating command) is received from the host system 11. In an exemplary embodiment, the specific operating command includes a flush command. However, in another exemplary embodiment, operating command of other types may also be used as the specific operating command. If the specific operating command is received, the memory management circuit 702 instructs the error checking and correcting circuit 708 to execute aforesaid operation of encoding the first data. In other words, in an exemplary embodiment, the operation of encoding the first data is executed in response to the specific operating command. If the specific operating command is not received, the operation of encoding the first data may not be executed until the second type physical units corresponding to the first type physical units stored with the first data are programmed. For example, in another exemplary embodiment of FIG. 9, if the specific operating command is not received, after the first type physical units 610(0) to 610(11) are programmed, a part of data of the second data may be directly stored into any one of the second type physical units 620(0) to 620(11) without encoding the first data.

In this exemplary embodiment, the first data may also be the user data or the system data, and the second data may also be the user data or the system data. Herein, the user data refers to data to be stored as instructed by the write command from the host system 11, and the system data refers management data (e.g., various management table including the logical-physical mapping table, etc.) of the rewritable non-volatile memory module 406.

Under certain circumstances (e.g., when the host system 11 is about to shut down, reboot or clean up memory), the host system 11 can issue the flush command to the memory storage device 10, so as to instruct the memory storage device 10 to store important data immediately. Generally, after the flush command is received, if a second type physical unit corresponding to one specific first type physical unit is not stored with data, dummy data will be written into such empty second type physical unit in order to protect the corresponding first type physical unit from losing data easily due to causes like sudden power loss. Herein, the dummy data refers to data without specific meanings (e.g., a series of bits 0) or invalid data. However, according to the foregoing exemplary embodiment, after the data stored in the first type physical unit is encoded, any data may be continuously written into the corresponding second type physical unit. Later, even if a programming failure does occur, errors in the first type physical unit may also be corrected by using the encoded data generated in advance at any time point. In other words, in an exemplary embodiment, even if the flush command is received, it is not required to write the dummy data into the second type physical unit corresponding to the first type physical unit which needs to be protected, so as to extend a service life of the memory storage device.

In an exemplary embodiment, the encoded data generated by encoding the first data is configured to correct a predetermined number of error bits. Herein, the predetermined number refers to at most how many error bits can be corrected by the encoded data. The predetermined number is greater if an error correcting ability of the encoded data is stronger. The predetermined number is smaller if the error correcting ability of the encoded data is weaker. For example, the predetermined number may be expressed as a capacity of a N umber of physical units. In this exemplary embodiment, each of the physical units is configured to store 256 bytes of data, and thus the predetermined number may be expressed as 256×N bytes. However, in another exemplary embodiment, the predetermined number may also be expressed by using other methods.

In an exemplary embodiment, when it is intended to program the second type physical units corresponding to the first type physical units 610(0) to 610(11), an amount of channels (or memory planes) accessible in parallel in one programming procedure is limited to be less than a channel total number. The channel total number is related to aforesaid error correcting ability of the encoded data. For example, the channel total number may be positively correlated to aforesaid predetermined number. In other words, the channel total number may be set as a greater value if the error correcting ability of the encoded data corresponding to the data (i.e., the first data) stored in the first type physical units is stronger; and the channel total number may be set as a smaller value if the error correcting ability of the encoded data corresponding the first data is weaker. By limiting the amount of the channels (or the memory planes) accessible in parallel during process of programming the second type physical units, an amount of the first type physical units possibly being influenced in the same programming procedure may be reduced while ensuring that a total number of bits to be corrected later in the first type physical units is not greater than aforesaid predetermined number.

Figure 10:
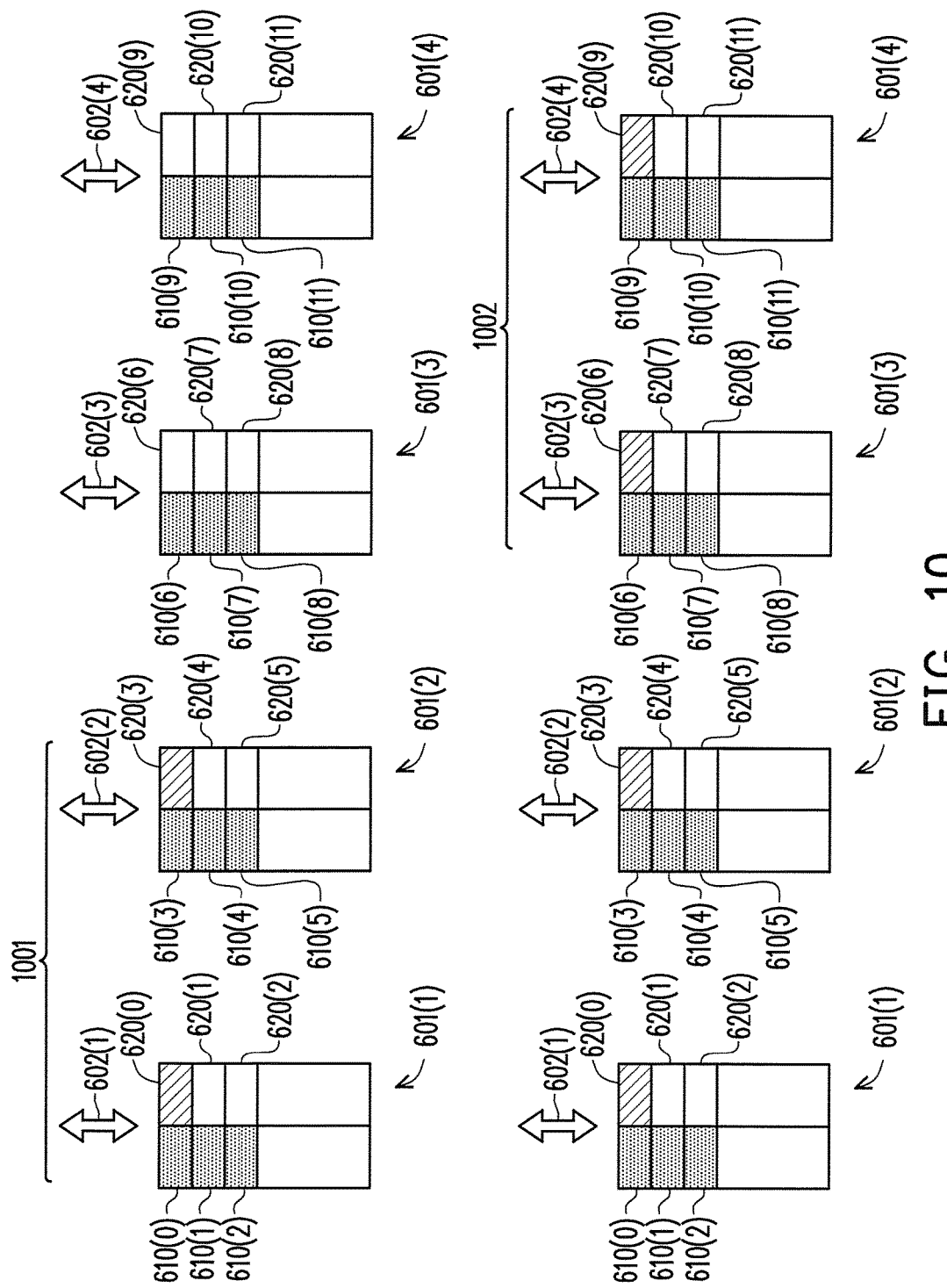
FIG. 10 illustrates a schematic diagram for programming the second type physical units according to an exemplary embodiment of the disclosure.

FIG. 10 illustrates a schematic diagram for programming the second type physical units according to an exemplary embodiment of the disclosure.

Referring to FIG. 9 and FIG. 10, when it is assumed that the encoded data 902 may be used to correct at most 512 bytes (i.e., a total capacity of two physical units) of error bits, the memory management circuit 702 limits that two second physical units in two memory planes can be programmed in parallel through at most two channels per one programming procedure. For example, the memory management circuit 702 instructs the rewritable non-volatile memory module 406 to execute a programming procedure 1001 to store a part of data of the second data. In the programming procedure 1001, the second type physical units 620(0) and 620(3) are programmed in parallel through the channels 602(1) and 602(2). In particular, an amount of the channels (e.g., the channels 602(1) and 602(2)) used in parallel in the programming procedure 1001 is less than a total number of a plurality of usable channels in the channels 602(1) to 602(4). Herein, each of the usable channels refers to a channel among the channels 602(1) to 602(4) predetermined as capable to be used for writing at least a part of data of the second data when the second data is received (or when the second data is to be stored). For example, when the second data is received, if the channels 602(1) to 602(4) are all in an idle state, each of the channels 602(1) to 602(4) may be regarded as one usable channel. Alternatively, when the second data is received, if the channels 602(1) to 602(3) are all in the idle state but the channel 602(4) is in a busy state (or a performance of the memory storage device 10 is insufficient to support accessing data through four channels at the same time), each of the channels 602(1) to 602(3) may be regarded as one usable channel. In other words, in the programming procedure 1001, even if there are more channels that can be used to execute the data writing operation for more memory planes in parallel, those channels used in parallel are still only the channels 602(1) and 602(2).

After the programming procedure 1001 is completed, the memory management circuit 702 instructs the rewritable non-volatile memory module 406 to continue executing a programming procedure 1002 to store another part of data of the second data. In the programming procedure 1002, the second type physical units 620(6) and 620(9) are programmed in parallel through the channels 602(3) and 602 (4). In particular, an amount of the channels (e.g., the channels 602(3) and 602(4)) used in parallel in the programming procedure 1002 is also less than the total number of the usable channels in the channels 602(1) to 602(4). Thereafter, if there are still other parts of data of the second data yet to be stored, at least one programming procedure may be executed accordingly. In that case, two second type physical units (e.g., the second type physical units 620(1) and 620(4)) in two memory planes may be programmed in parallel per one programming procedure until all of the second type physical units 620(0) to 620(11) are fully written.

It is worth mentioning that, in an exemplary embodiment of FIG. 10, even if said another part of data of the second data is already received, the memory management circuit 702 still executes the programming procedure 1001 first. The programming procedure 1002 for storing said another part of data of the second data is executed only after the programming procedure 1001 is completed.

In another exemplary embodiment of FIG. 10, if the programming procedure for any two second type physical units fails or abnormally ends due to factors like sudden power loss in any programming procedure for the second type physical units, a large amount of errors may occur in the data of the corresponding first type physical units. In this case, after being powered on again on or at any time point, the error checking and correcting circuit 708 can execute a decoding procedure for the data stored in the first type physical units based on the encoded data generated in advance. During the decoding operation, the data stored in the first type physical units is read so the errors therein may be corrected. For example, for the programming procedure 1001 that fails or abnormally ends, a decoding procedure based on the encoded data 902 may be executed. Accordingly, there is a great chance that the errors generated in the first type physical units 610(0) and 610(3) may be completely corrected. Alternatively, for the programming procedure 1002 that fails or abnormally ends, another decoding procedure based on the encoded data 902 may be executed. Accordingly, there is also a great probability that the errors generated in the first type physical units 610(6) and 610(9) may be completely corrected.

In an exemplary embodiment, if the programming procedure is executed by using all of the usable channels in parallel for storing the second data, although the programming procedure may be executed more efficiently, there can be too many first type physical units influenced in the same programming procedure and the error bits generated therein may not be completely corrected. For example, in another exemplary embodiment of FIG. 9 and FIG. 10, if the programming procedures 1001 and 1002 are executed in parallel and power loss occurs during the programming procedures 1001 and 1002, a large mount of errors may occur in all of the data stored in the first type physical units 610(0), 610(3), 610(6) and 610(9). In this case, because the total number of bits that need to be corrected exceeds aforesaid predetermined number (i.e., the total capacity of two physical units), the data stored in the first type physical units 610(0), 610(3), 610(6) and 610(9) may all be regarded as invalid or damaged. Therefore, in the exemplary embodiment of FIG. 10, after the first data stored in the first type physical units is encoded, by sequentially using a part of the usable channels to execute the programming procedure for the corresponding second type physical units (e.g., sequentially executing the programming procedures 1001 and 1002), the capability of protecting the data in the first type physical units may be further enhanced.

In another exemplary embodiment, the similar effectiveness of reducing the total number of the channels/the memory planes used in parallel per one programming procedure as mentioned in the foregoing exemplary embodiment may also be achieved by enhancing the error correcting ability of the encoded data.

Figure 11:
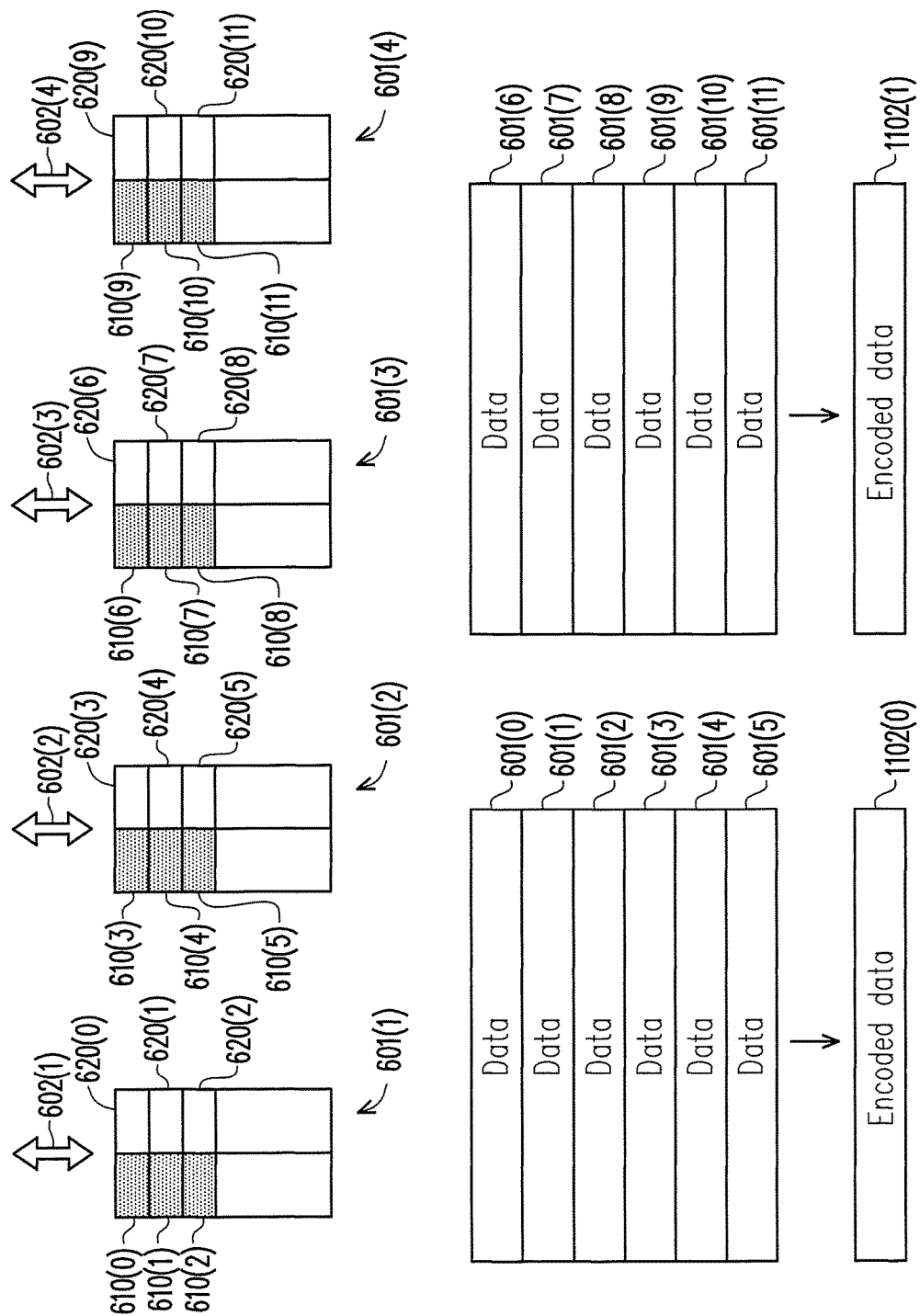
FIG. 11 and FIG. 12 are schematic diagrams illustrating a data programming procedure according to an exemplary embodiment of the disclosure.
Figure 12:
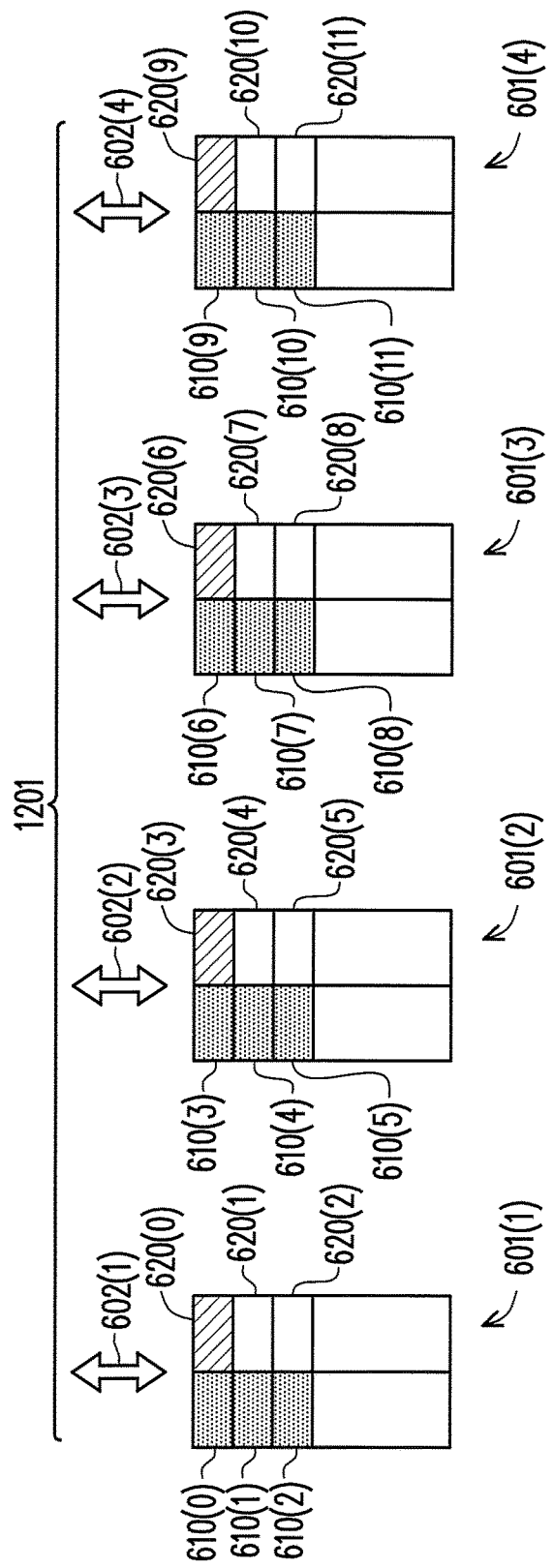

FIG. 11 and FIG. 12 are schematic diagrams illustrating a data programming procedure according to an exemplary embodiment of the disclosure.

Referring to FIG. 11, in this exemplary embodiment, the memory management circuit 702 programs the first type physical units 610(0) to 610(11) to store first data, and the error checking and correcting circuit 708 executes the encoding procedure containing the multi-frame encoding in order to encode the first data to generate the corresponding encoded data. As compared to the exemplary embodiment of FIG. 9, the error correcting ability of the encoded data generated by encoding the first data is stronger in this exemplary embodiment. Further, the operation of encoding the first data in this exemplary embodiment may be executed in response to aforesaid specific operating command or may be executed at any time point.

In this exemplary embodiment, the error checking and correcting circuit 708 encodes data (i.e., a part of data of the first data) stored in the first type physical units 610(0) to 610(5) to generate encoded data 1102(0) and encodes data (i.e., another part of data of the first data) stored in the first type physical units 610(6) to 610(11) to generate encoded data 1102(1).

In this exemplary embodiment, the encoded data 1102(0) and 1102(1) are independent of each other. Herein, the encoded data 1102(0) and 1102(1) being independent of each other means that the encoded data 1102(0) and 1102(1) may be used to decode different data, respectively. For example, the encoded data 1102(0) may be used to decode the data stored in the first type physical units 610(0) to 610(5), and the encoded data 1102(1) may be used to decode the data stored in the first type physical units 610(6) to 610(11). In this exemplary embodiment, each of the encoded data 1102(0) and 1102(1) may be used to correct the predetermined number (e.g., 512 bytes) of the error bits. In other words, the encoded data 1102(0) and 1102(1) may be used to correct at most 1024 bytes of error bits in total. However, in another exemplary embodiment, the encoded data 1102(0) and 1102(1) may also be used to correct more or less error bits.

Referring to FIG. 12, after the first type physical units 610(0) to 610(11) are programmed, the memory management circuit 702 instructs the rewritable non-volatile memory module 406 to execute a programming procedure 1201 to store at least a part of data of the second data. Particular, as compared to the exemplary embodiment of FIG. 10, more usable channels may be used in parallel to program more second type physical units in the programming procedure 1201. For example, when the second data is to be stored and the channels 602(1) to 602(4) are all in the idle state, the second type physical units 620(0), 620(3), 620(6) and 620(9) may be programmed in parallel through the channels 602(1) to 602(4).

In an exemplary embodiment, if the operation of executing the programming procedure 1201 fails or abnormally ends, the error checking and correcting circuit 708 can execute corresponding decoding procedures for the data stored in the first type physical units 610(0) to 610(5) and 610(6) to 610(11), respectively, based on the encoded data 1102(0) and 1102(1). For example, based on the encoded data 1102(0), the errors generated in the first type physical units 610(0) to 610(5) in correspondence to process of programming the second type physical units 620(0) and 620(3) in the programming procedure 1201 may be corrected; and based on the encoded data 1102(1), the errors generated in the first type physical units 610(6) to 610(9) in correspondence to process of programming the second type physical units 620(6) and 620(9) in the programming procedure 1201 may also be corrected.

More specifically, if the programming procedure 1201 fails or abnormally ends (e.g., power loss occurs during the programming procedure 1201), it is a great chance that a large amount of errors may synchronously occur in the first type physical units 610(0), 610(3), 610(6) and 610(9). After the memory storage device 10 is powered on again or rebooted, even if the single-frame encoding (the encoding procedure executed with one single physical unit as a basic unit) is executed in advance for the first data stored in the first type physical units 610(0), 610(3), 610(6) and 610(9), such large amount of the errors can still not be completely corrected simply by using the corresponding single-frame decoding procedure (i.e., the decoding procedure executed with data in one single physical unit as a basic unit). However, in the exemplary embodiment of FIG. 12, each the encoded data 1102(0) and the encoded data 1102(1) may be used to correct 512 bytes of error bits (i.e., a data amount of two physical units). Therefore, there is a great chance that the errors in the first type physical units 610(0) and 610(3) may be completely corrected by using the encoded data 1102(0); and there is also a great chance that the errors in the first type physical units 610(6) and 610(9) may be completely corrected by using the encoded data 1102(1).

In other words, as compared to the exemplary embodiments of FIG. 9 and FIG. 10, the error correcting ability of the encoded data for protecting the first data stored in the first type physical units is stronger, and use of more memory spaces is required to store such encoded data; and yet, owing to more channels/memory planes used per one programming procedure, a writing efficiency or a writing speed for the data can be improved.

In an exemplary embodiment, whether to enhance the error correcting ability of the encoded data or not may also be determined according to whether aforesaid specific operating command (e.g., the flush command) is received. For example, in an exemplary embodiment, the error correcting ability of the encoded data 902 of FIG. 9 is known as a first error correcting ability and the error correction capabilities of the encoded data 1102(0) and 1102(1) of FIG. 11 are collectively known as a second error correcting ability. For example, the first error correcting ability is corresponding to correction for at most a first predetermined number of error bits and the second error correcting ability is corresponding to correction for at most a second predetermined number of error bits, where the second predetermined number is greater than the first predetermined number. In this exemplary embodiment, when the specific operating command is received, the first data may be encoded according to the specific operating command to generate the encoded data having the second error correcting ability; otherwise, if the specific operating command is not received, the first data may be encoded to generate the encoded data having the first error correcting ability that is relatively poor.

In an exemplary embodiment, the operation of reducing the total number of the channels/the memory planes used in parallel per one programming procedure as mentioned in the foregoing exemplary embodiment may also be used in combination with the operation of enhancing the error correcting ability of the encoded data.

Figure 13:
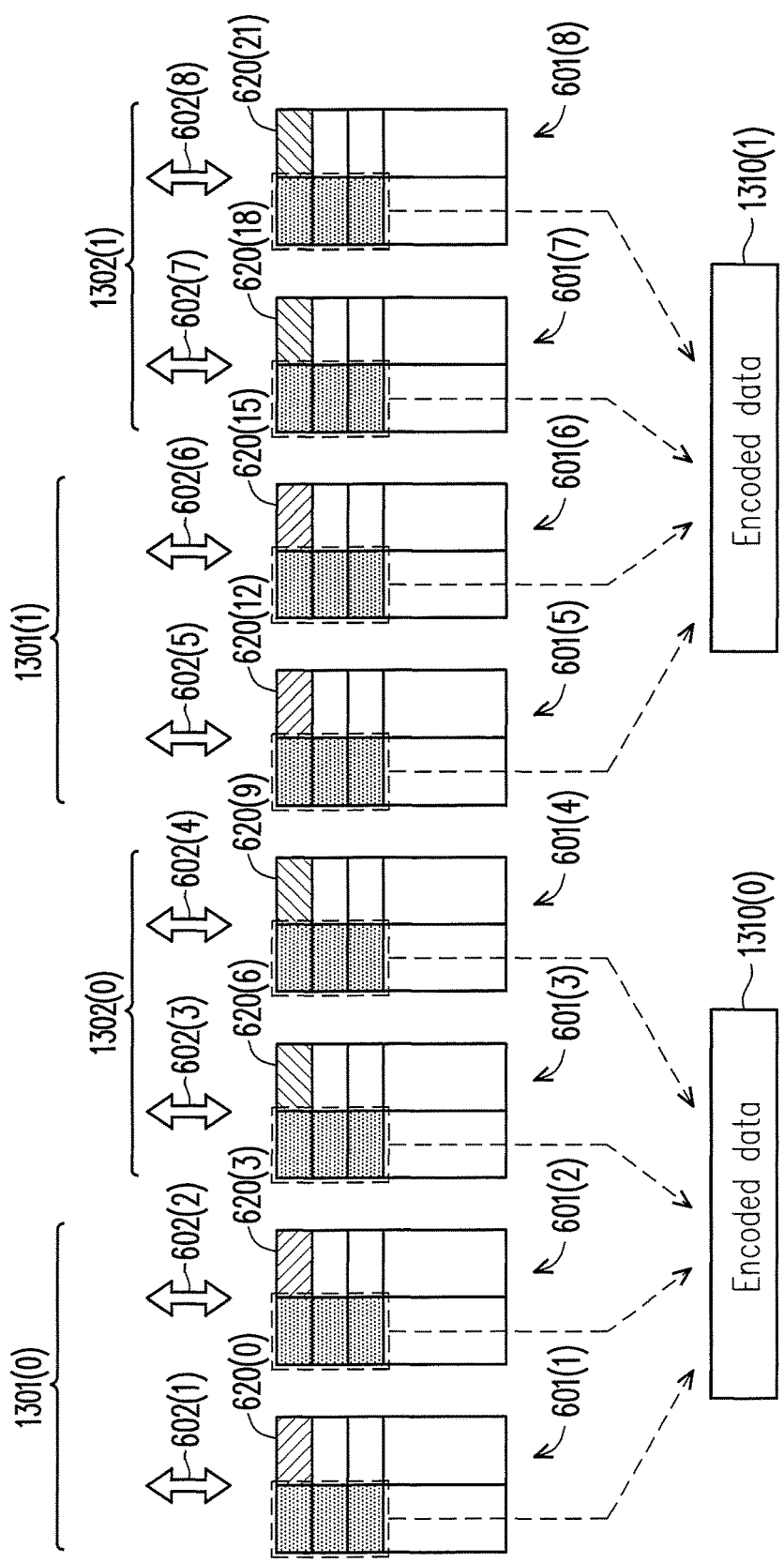
FIG. 13 is a schematic diagram illustrating a data programming procedure according to another exemplary embodiment of the disclosure.

FIG. 13 is a schematic diagram illustrating a data programming procedure according to another exemplary embodiment of the disclosure.

Referring to FIG. 13, in this exemplary embodiment, the rewritable non-volatile memory module 406 having eight memory planes 601(1) to 601(8) is taken as an example. After the first data is stored into a part of the first type physical units (represented by mesh points in FIG. 13) in the memory planes 601(1) to 601(8), a part of data of the first data stored in the memory planes 601(1) to 601(4) may be encoded as encoded data 1310(0) and another part of data of the first data stored in the memory planes 601(5) to 601(8) may be encoded as encoded data 1310(1). In this exemplary embodiment, each of the encoded data 1310(0) and the encoded data 1310(1) is used to correct aforesaid predetermined number (e.g., 512 bytes) of error bits. However, in another exemplary embodiment, each of the encoded data 1310(0) and the encoded data 1310(1) may also be used to correct more or less error bits.

Thereafter, when the second data is to be stored and all of the channels 602(1) to 602(8) are assumed to be the usable channels, programming procedures 1301(0) and 1301(1) will be executed in parallel first. For example, in the programming procedures 1301(0) and 1301(1), the second type physical units 620(0), 620(3), 620(12) and 620(15) are programmed in parallel through the channels 602(1), 602(2), 602(5) and 602(6) to store a part of data of the second data. After the programming procedures 1301(0) and 1301(1) are executed, programming procedures 1302(0) and 1302(1) are executed in parallel. For example, in the programming procedures 1302(0) and 1302(1), the second type physical units 620(6), 620(9), 620(18) and 620(21) are programmed in parallel through the channels 602(3), 602(4), 602(7) and 602(8) to store another part of data of the second data.

In an exemplary embodiment, if the programming procedures 1301(0) and 1301(1) fail or abnormally end (e.g., power loss occurs during the programming procedures), the encoded data 1310(0) is used (e.g., after being powered on again) to decode the part of data of the first data stored in the memory planes 601(1) to 601(4) in order to correct errors generated in the memory planes 601(1) and 601(2) and caused by programming the second type physical units 620(0) and 620(3); and the encoded data 1310(1) is used to decode the part of data of the first data stored in the memory planes 601(5) to 601(8) in order to correct errors generated in the memory planes 601(5) and 601(6) and caused by programming the second type physical units 620(12) and 620(15). Alternatively, when errors occur in the programming procedures 1302(0) and 1302(1) (e.g., power loss occurs during the programming procedures), the encoded data 1310(0) is used to decode the part of data of the first data stored in the memory planes 601(1) to 601(4) in order to correct errors generated in the memory planes 601(3) and 601(4) and caused by programming the second type physical units 620(6) and 620(9); and the encoded data 1310(1) is used to decode the part of data of the first data stored in the memory planes 601(5) to 601(8) in order to correct errors generated in the memory planes 601(7) and 601(8) and caused by programming the second type physical units 620(18) and 620(21).

More specifically, in an exemplary embodiment where the programming procedures 1301(0) and 1301(1) fail or abnormally end, the encoded data 1310(0) may be used to correct a large amount of errors generated in two first type physical units corresponding to the second type physical units 620(0) and 620(3) and caused by the programming procedures 1301(0) and 1301(1) that fail or abnormally end, whereas the encoded data 1310(1) may be used to correct a large amount of errors generated in two first type physical units corresponding to the second type physical units 620(12) and 620(15) and caused by the programming procedures 1301(0) and 1301(1) that fail or abnormally end. In an exemplary embodiment where the programming procedures 1302(0) and 1302(1) fail or abnormally end, the encoded data 1310(0) may be used to correct a large amount of errors generated in two first type physical units corresponding to the second type physical units 620(6) and 620(9) and caused by the programming procedures 1302(0) and 1302(1) that fail or abnormally end, whereas the encoded data 1310(1) may be used to correct a large amount of errors generated in two first type physical units corresponding to the second type physical units 620(18) and 620(21) and caused by the programming procedures 1302(0) and 1302(1) that fail or abnormally end.

Figure 14:
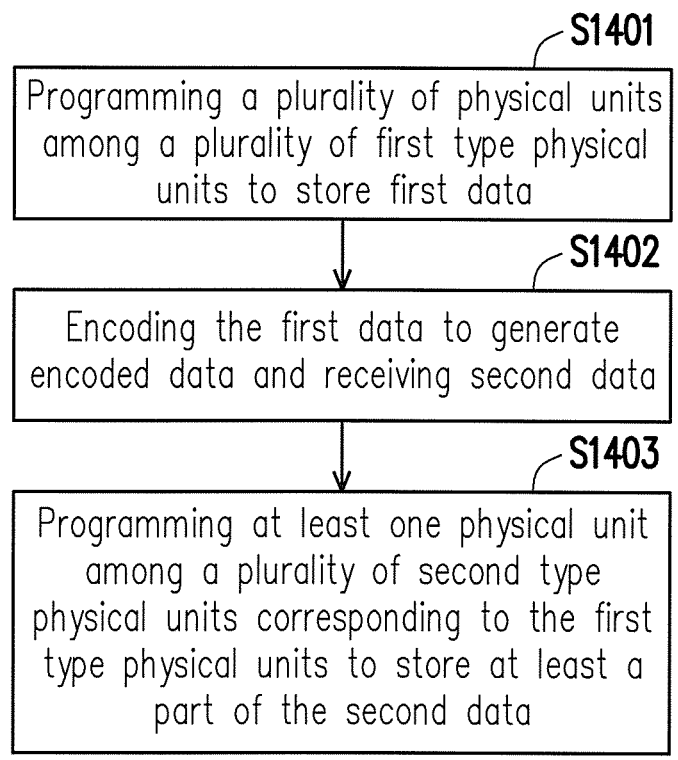
FIG. 14 is a flowchart illustrating a data programming method according to an exemplary embodiment of the disclosure.

FIG. 14 is a flowchart illustrating a data programming method according to an exemplary embodiment of the disclosure.

Referring to FIG. 14, in step S1401, a plurality of physical units among a plurality of first type physical units in a rewritable non-volatile memory module are programmed to store first data. In step S1402, the first data is encoded to generate encoded data and second data is received. In step S1403, at least one physical unit among a plurality of second type physical units corresponding to the first type physical units in the rewritable non-volatile memory module is programmed to store at least a part of data of the second data.

Figure 15:
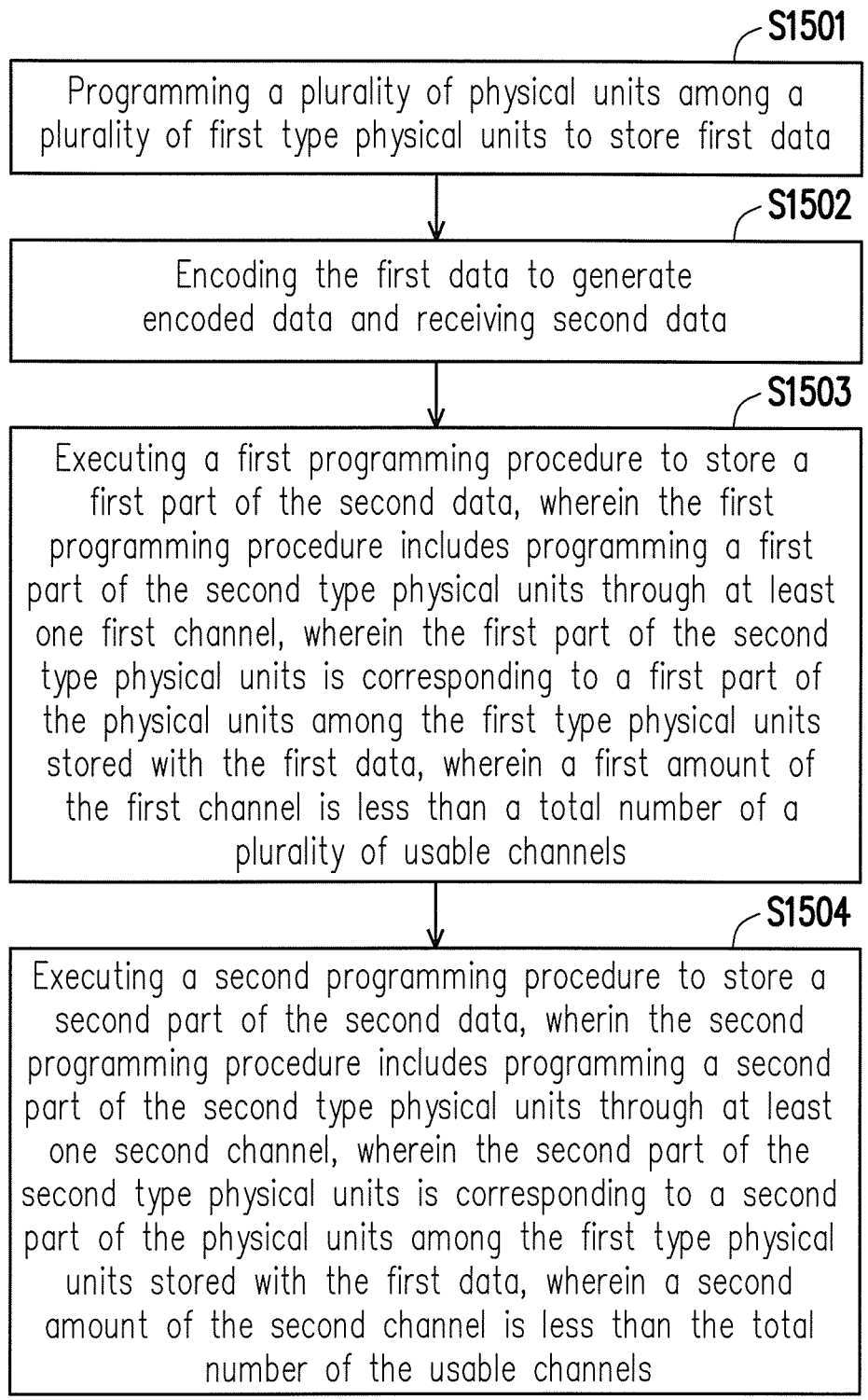
FIG. 15 is a flowchart illustrating a data programming method according to another exemplary embodiment of the disclosure.

FIG. 15 is a flowchart illustrating a data programming method according to another exemplary embodiment of the disclosure.

Referring to FIG. 15, in step S1501, a plurality of physical units among a plurality of first type physical units are programmed to store first data. In step S1502, the first data is encoded to generate encoded data and second data is received. In step S1503, a first programming procedure is executed to store a first part of the second data. Herein, the first programming procedure includes programming a first part of the second type physical units through at least one first channel. Herein, the first part of the second type physical units corresponds to a first part of the physical units among the first type physical units stored with the first data. Herein, a first amount of the first channel is less than a total number of a plurality of usable channels. In step S1504, a second programming procedure is executed to store a second part of the second data. Herein, the second programming procedure includes programming a second part of the second type physical units through at least one second channel. Herein, the second part of the second type physical units corresponds to a second part of the physical units among the first type physical units stored with the first data. Herein, a second amount of the second channel is also less than the total number of the usable channels. It is worth mentioning that, in the present exemplary embodiment, the operation of step S1504 is executed only after the operation of step S1503 is completed.

Figure 16:
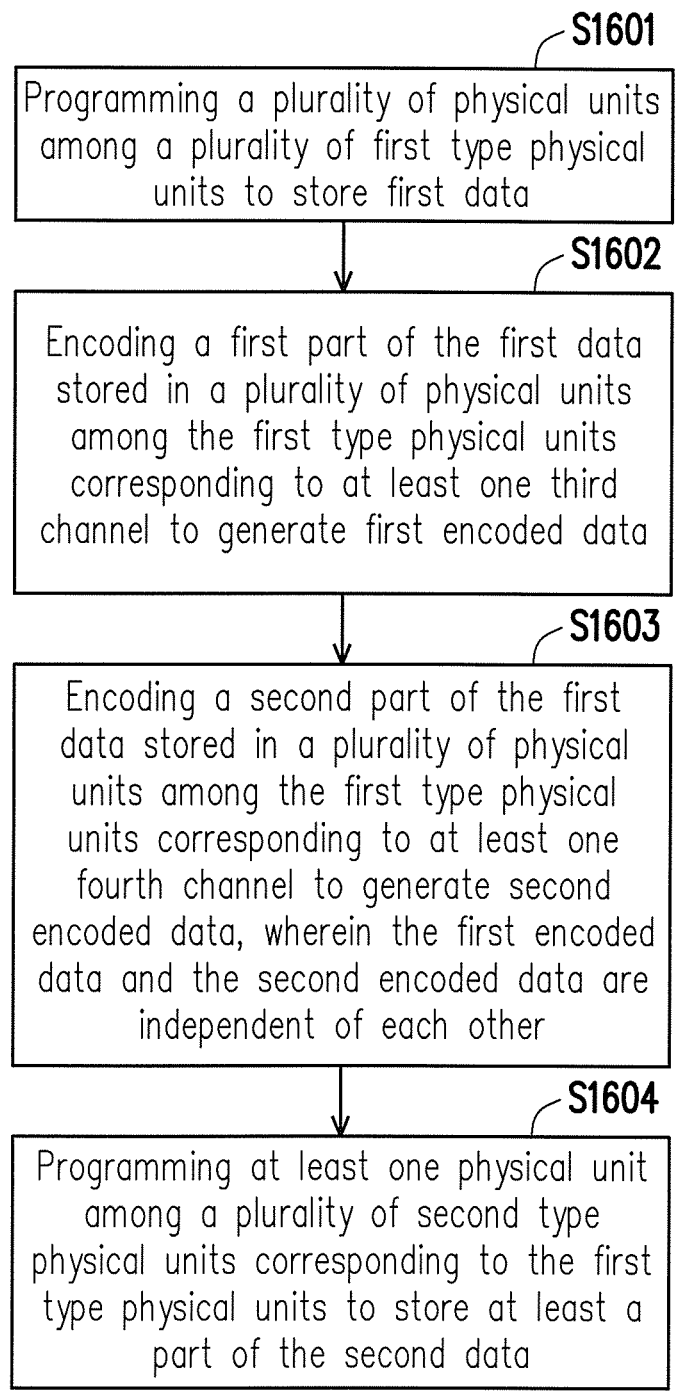
FIG. 16 is a flowchart illustrating a data programming method according to another exemplary embodiment of the disclosure.

FIG. 16 is a flowchart illustrating a data programming method according to another exemplary embodiment of the disclosure.

Referring to FIG. 16, in step S1601, a plurality of physical units among a plurality of first type physical units are programmed to store first data. In step S1602, a first part of the first data stored in a plurality of physical units among the first type physical units corresponding to at least one third channel is encoded to generate first encoded data. In step S1603, a second part of the first data stored in a plurality of physical units among the first type physical units corresponding to at least one fourth channel is encoded to generate second encoded data. Herein, the first encoded data and the second encoded data are independent of each other. In step S1604, at least one physical unit among a plurality of second type physical units corresponding to the first type physical units is programmed to store at least a part of data of the second data.

Figure 17:
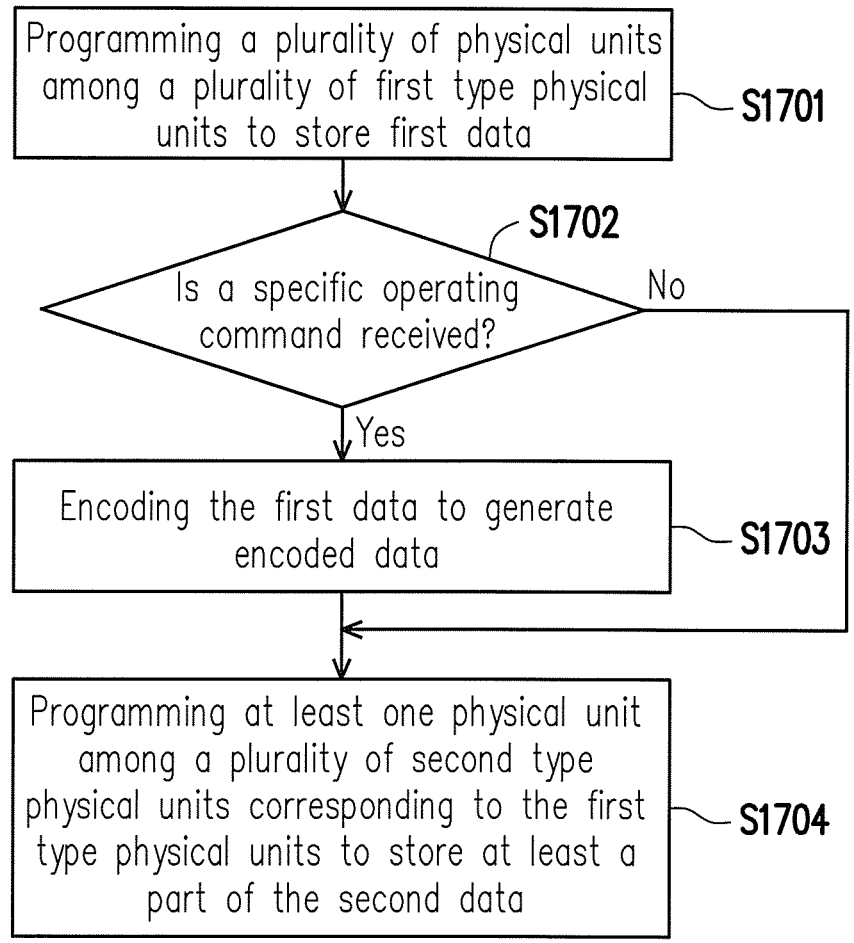
FIG. 17 is a flowchart illustrating a data programming method according to another exemplary embodiment of the disclosure.

FIG. 17 is a flowchart illustrating a data programming method according to another exemplary embodiment of the disclosure.

Referring to FIG. 17, in step S1701, a plurality of first type physical units are programmed to store first data. In step S1702, whether a specific operating command is received is determined. For example, the specific operating command may be a flush command. In addition, second data is also received. If the specific operating command is received, in step S1703, the first data is encoded to generate encoded data. In step S1704, at least one physical unit among a plurality of second type physical units corresponding to the first type physical units is programmed to store at least a part of data of the second data. If the specific operating command is not received, after the second data is received, step S1704 is directly executed without encoding the first data.

Nevertheless, each of steps depicted in FIG. 14 to FIG. 17 have been described in detail as above, and thus related description thereof is not repeated hereinafter. It should be noted that, the steps depicted in FIG. 14 to FIG. 17 may be implemented as a plurality of program codes or circuits, which are not particularly limited in the disclosure. Moreover, the methods disclosed in FIG. 14 to FIG. 17 may be implemented with reference to above embodiments, or may be implemented separately, which are not particularly limited in the disclosure.

In summary, in one exemplary embodiment, the first data stored in the first type physical units corresponding to multiple channels is encoded. For example, the operation of encoding the first data may be executed in response to one specific operating command. In another exemplary embodiment, after the first data is stored, if it is required to use the corresponding second type physical units for storing data, the correctness of the data belonging to the pair physical units in the multi-channel programming procedure may be maintained by adjusting the total number of the channels usable in parallel in the programming procedure and/or adjusting the error correcting ability of the encoded data corresponding to the first data.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A data programming method for a rewritable non-volatile memory module, wherein the rewritable non-volatile memory module comprises a plurality of physical units, wherein the physical units are corresponding to a plurality of channels, wherein the physical units comprise a plurality of first type physical units and a plurality of second type physical units corresponding to the first type physical units, and the data programming method comprises:
sending, by a memory management circuit, a write command sequence which instructs a programming of a plurality of physical units among the first type physical units to store first data;
encoding, by an error checking and correcting circuit, the first data to generate encoded data;
receiving second data; and
sending, by the memory management circuit, a write command sequence which instructs a programming of at least one physical unit among the second type physical units to store at least a part of data of the second data after the first data is encoded,
wherein an operation order of a data programming of the rewritable non-volatile memory module and a data encoding of the error checking and correcting circuit is dynamically adjusted by the memory management circuit.

2. The data programming method of claim 1, wherein the encoded data is configured to correct errors generated in the physical units for storing the first data and caused by programming the at least one physical unit among the second type physical units.

3. The data programming method of claim 1, wherein the step of programming of the at least one physical unit among the second type physical units comprises:
executing a first programming procedure to store a first part of the second data, wherein the first programming procedure comprises programming a first part of the physical units among the second type physical units through at least one first channel among the channels, wherein the first part of the physical units among the second type physical units corresponds to a first part of the physical units among the physical units for storing the first data, wherein a first amount of the at least one first channel is less than a total number of a plurality of usable channels among the channels; and
executing a second programming procedure to store a second part of the second data after the first programming procedure is executed, wherein the second programming procedure comprises programming a second part of the physical units among the second type physical units through at least one second channel among the channels, wherein the second part of the physical units among the second type physical units corresponds to a second part of the physical units among the physical units for storing the first data, wherein a second amount of the at least one second channel is less than the total number of the usable channels.

4. The data programming method of claim 3, wherein the usable channels refer to a plurality of channels among the channels predetermined to be used in parallel in correspondence to the second data when the second data is received.

5. The data programming method of claim 3, wherein the encoded data is configured to correct a first error of data stored in the first part of the physical units among the physical units for storing the first data, or correct a second error of data stored in the second part of the physical units among the physical units for storing the first data,
wherein a total number of error bits of the first error is less than or equal to a maximum value of a total number of error bits correctable by the encoded data,
wherein a total number of error bits of the second error is less than or equal to the maximum value of the total number of the error bits correctable by the encoded data.

6. The data programming method of claim 5, wherein the first error is generated in correspondence to the first programming procedure, wherein the second error is generated in correspondence to the second programming procedure.

7. The data programming method of claim 1, wherein the step of encoding the first data to generate the encoded data comprises:
encoding a first part of the first data to generate first encoded data, wherein the first part of the first data is data among the first data stored in a plurality of physical units among the first type physical units corresponding to at least one third channel among the channels; and
encoding a second part of the first data to generate second encoded data, wherein the second part of the first data is data among the first data stored in a plurality of physical units among the first type physical units corresponding to at least one fourth channel among the channels,
wherein the first encoded data and the second encoded data are independent of each other.

8. The data programming method of claim 1, further comprising:
determining whether a specific operating command is received,
wherein the step of encoding the first data is executed in response to the specific operating command being received.

9. The data programming method of claim 8, wherein the specific operating command comprises a flush command.

10. The data programming method of claim 8, further comprising:
not encoding the first data until the at least one physical unit among the second type physical units is programmed if the specific operating command is not received.

11. The data programming method of claim 1, wherein the step of encoding the first data comprises performing a multi-frame encoding on data to be stored in at least two of the physical units,
wherein the data programming method further comprises performing a single-frame encoding on data to be stored in one of the physical units.

12. A memory storage device, comprising:
a connection interface unit, configured to couple to a host system;
a rewritable non-volatile memory module, wherein the rewritable non-volatile memory module comprises a plurality of physical units, wherein the physical units are corresponding to a plurality of channels, wherein the physical units comprise a plurality of first type physical units and a plurality of second type physical units corresponding to the first type physical units; and
a memory control circuit unit, coupled to the connection interface unit and the rewritable non-volatile memory module,
wherein the memory control circuit unit is configured to send a first write command sequence which instructs to program a plurality of physical units among the first type physical units to store first data, wherein the memory control circuit unit is further configured to encode the first data to generate encoded data, wherein the memory control circuit unit is further configured to receive second data, wherein the memory control circuit unit is further configured to send a second write command sequence which instructs to program at least one physical unit among the second type physical units to store at least a part of data of the second data after the first data is encoded, wherein an operation order of a data programming of the rewritable non-volatile memory module and a data encoding of the memory control circuit is dynamically adjusted by the memory control circuit.

13. The memory storage device of claim 12, wherein the encoded data is configured to correct errors generated in the physical units for storing the first data and caused by programming the at least one physical unit among the second type physical units.

14. The memory storage device of claim 12, wherein the second write command sequence instructs to execute a first programming procedure to store a first part of the second data and execute a second programming procedure to store a second part of the second data after the first programming procedure is executed, wherein the first programming procedure comprises programming a first part of the physical units among the second type physical units through at least one first channel among the channels, wherein the first part of the physical units among the second type physical units corresponds to a first part of the physical units among the physical units for storing the first data, wherein a first amount of the at least one first channel is less than a total number of a plurality of usable channels among the channels, wherein the second programming procedure comprises programming a second part of the physical units among the second type physical units through at least one second channel among the channels, wherein the second part of the physical units among the second type physical units corresponds to a second part of the physical units among the physical units for storing the first data, wherein a second amount of the at least one second channel is less than the total number of the usable channels.

15. The memory storage device of claim 14, wherein the usable channels refer to a plurality of channels among the channels predetermined to be used in parallel in correspondence to the second data when the second data is received.

16. The memory storage device of claim 14, wherein the encoded data is configured to correct a first error of data stored in the first part of the physical units among the physical units for storing the first data, or correct a second error of data stored in the second part of the physical units among the physical units for storing the first data, wherein a total number of error bits of the first error is less than or equal to a maximum value of a total number of error bits correctable by the encoded data, wherein a total number of error bits of the second error is less than or equal to the maximum value of the total number of the error bits correctable by the encoded data.

17. The memory storage device of claim 16, wherein the first error is generated in correspondence to the first programming procedure, wherein the second error is generated in correspondence to the second programming procedure.

18. The memory storage device of claim 12, wherein the operation of encoding the first data to generate the encoded data by the memory control circuit unit comprises:

encoding a first part of the first data to generate first encoded data, wherein the first part of the first data is data among the first data stored in a plurality of physical units among the first type physical units corresponding to at least one third channel among the channels; and encoding a second part of the first data to generate second encoded data, wherein the second part of the first data is data among the first data stored in a plurality of physical units among the first type physical units corresponding to at least one fourth channel among the channels, wherein the first encoded data and the second encoded data are independent of each other.

19. The memory storage device of claim 12, wherein the memory control circuit unit is further configured to determine whether a specific operating command is received, wherein the memory control circuit unit executes the operation of encoding the first data in response to the specific operating command being received.

20. The memory storage device of claim 19, wherein the specific operating command comprises a flush command.

21. The memory storage device of claim 19, wherein the memory control circuit unit does not encode the first data until the at least one physical unit among the second type physical units is programmed if the specific operating command is not received.

22. The memory storage device of claim 12, wherein the memory control circuit unit is further configured to encode the first data by performing a multi-frame encoding on data to be stored in at least two of the physical units, wherein the memory control circuit unit is further configured to perform a single-frame encoding on data to be stored in one of the physical units.

23. A data programming method for a rewritable non-volatile memory module, wherein the rewritable non-volatile memory module comprises a plurality of physical units, wherein the physical units are corresponding to a plurality of channels, wherein the physical units comprise a plurality of first type physical units and a plurality of second type physical units corresponding to the first type physical units, and the data programming method comprises:

sending, by a memory management circuit, a write command sequence which instructs a programming of a plurality of physical units among the first type physical units to store first data;

receiving second data;

sending, by the memory management circuit, a write command sequence which instructs a executing of a first programming procedure to store a first part of the second data after the first data is stored, wherein the first programming procedure comprises programming a first part of the physical units among the second type physical units through at least one first channel among the channels, wherein the first part of the physical units among the second type physical units corresponds to a first part of the physical units among the physical units for storing the first data, wherein a first amount of the at least one first channel is less than a total number of a plurality of usable channels among the channels; and instructs a executing of a second programming procedure to store a second part of the second data after the first programming procedure is executed, wherein the second programming procedure comprises programming a second part of the physical units among the second type physical units through at least one second channel among the channels, wherein the second part of the physical units among the second type physical units corresponds to a second part of the physical units among the physical units for storing the first data, wherein a second amount of the at least one second channel is less than the total number of the usable channels.

24. The data programming method of claim 23, wherein the usable channels refer to a plurality of channels among the channels predetermined to be used in parallel in correspondence to the second data when the second data is received.

25. A memory storage device, comprising:
a connection interface unit, configured to couple to a host system;
a rewritable non-volatile memory module, wherein the rewritable non-volatile memory module comprises a plurality of physical units, wherein the physical units are corresponding to a plurality of channels, wherein the physical units comprise a plurality of first type physical units and a plurality of second type physical units corresponding to the first type physical units; and
a memory control circuit unit, coupled to the connection interface unit and the rewritable non-volatile memory module,
wherein the memory control circuit unit is configured to send a first write command sequence which instructs to program a plurality of physical units among the first type physical units to store first data,
wherein the memory control circuit unit is further configured to receive second data,
wherein the memory control circuit unit is further configured to send a second write command sequence which instructs to execute a first programming procedure to store a first part of the second data after the first data is stored and execute a second programming procedure to store a second part of the second data after the first programming procedure is executed,
wherein the first programming procedure comprises programming a first part of the physical units among the second type physical units through at least one first channel among the channels, wherein the first part of the physical units among the second type physical units corresponds to a first part of the physical units among the physical units for storing the first data, wherein a first amount of the at least one first channel is less than a total number of a plurality of usable channels among the channels,
wherein the second programming procedure comprises programming a second part of the physical units among the second type physical units through at least one second channel among the channels, wherein the second part of the physical units among the second type physical units corresponds to a second part of the physical units among the physical units for storing the first data, wherein a second amount of the at least one second channel is less than the total number of the usable channels.

26. The memory storage device of claim 25, wherein the usable channels refer to a plurality of channels among the channels predetermined to be used in parallel in correspondence to the second data when the second data is received.

* * * * *